United States Patent
Li et al.

(10) Patent No.: US 12,034,195 B2
(45) Date of Patent: Jul. 9, 2024

(54) BAND-STOP FILTER AND ELECTRONIC DEVICE

(71) Applicant: Huawei Technologies Co., Ltd., Shenzhen (CN)

(72) Inventors: Yantao Li, Chengdu (CN); Dan Liang, Shenzhen (CN); Xiaofeng Zhang, Kista (SE); Zhiyu Liu, Chengdu (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 211 days.

(21) Appl. No.: 17/727,441

(22) Filed: Apr. 22, 2022

(65) Prior Publication Data

US 2022/0247057 A1 Aug. 4, 2022

Related U.S. Application Data

(63) Continuation of application No. PCT/CN2019/113132, filed on Oct. 24, 2019.

(51) Int. Cl.
| | |
|---|---|
| *H01P 1/20* | (2006.01) |
| *H01P 1/208* | (2006.01) |
| *H03H 7/01* | (2006.01) |
| *H01P 1/202* | (2006.01) |

(52) U.S. Cl.
CPC ......... *H01P 1/2002* (2013.01); *H01P 1/2088* (2013.01); *H03H 7/0115* (2013.01); *H01P 1/202* (2013.01)

(58) Field of Classification Search
CPC ....... H01P 1/2002; H01P 1/2088; H01P 1/202
USPC ...................... 333/208–212, 219.1
See application file for complete search history.

(56) References Cited

U.S. PATENT DOCUMENTS

| | | | |
|---|---|---|---|
| 5,065,119 A | 11/1991 | Jachowski | |
| 6,844,797 B2* | 1/2005 | Kido | H01P 1/2056 333/219.1 |
| 2003/0218521 A1 | 11/2003 | Andoh | |
| 2014/0097913 A1 | 4/2014 | Cooper et al. | |

(Continued)

FOREIGN PATENT DOCUMENTS

| | | |
|---|---|---|
| CN | 101317299 A | 12/2008 |
| CN | 102637925 A | 8/2012 |
| CN | 103474729 A | 12/2013 |

(Continued)

*Primary Examiner* — Rakesh B Patel
(74) *Attorney, Agent, or Firm* — Leydig, Voit & Mayer, Ltd.

(57) ABSTRACT

This application relates to the field of communications component technologies, and provides a band-stop filter and an electronic device. The band-stop filter includes: a waveguide transmission line, configured to transmit electromagnetic waves; and a plurality of dielectric resonance units, sequentially arranged along an extension track of the waveguide transmission line, and configured to be coupled to the waveguide transmission line, where the dielectric resonance units each include at least one dielectric resonator; the dielectric resonator includes a first dielectric block and a first conductive layer covering an outer surface of the first dielectric block; and a first surface of the first dielectric block has a blind hole, and the first conductive layer covers an inner surface of the blind hole; where a dielectric constant of a material that forms the first dielectric block is greater than 1.

19 Claims, 19 Drawing Sheets

(56) References Cited

U.S. PATENT DOCUMENTS

2016/0036116 A1 2/2016 Yuan et al.
2016/0172733 A1 6/2016 Cooper et al.

FOREIGN PATENT DOCUMENTS

| | | | |
|---|---|---|---|
| CN | 104868211 | A | 8/2015 |
| CN | 105070991 | A | 11/2015 |
| CN | 204834806 | U | 12/2015 |
| CN | 106571505 | A | 4/2017 |
| CN | 206480740 | U | 9/2017 |
| CN | 110224205 | A | 9/2019 |
| CN | 110336104 | A | 10/2019 |
| EP | 0501389 | A2 | 9/1992 |
| JP | 2001203506 | A | 7/2001 |
| KR | 100729969 | B1 | 6/2007 |
| KR | 101158848 | B1 | 6/2012 |
| KR | 20160102732 | A | 8/2016 |
| WO | 2001052344 | A1 | 7/2001 |
| WO | 2007039360 | A1 | 4/2007 |

\* cited by examiner

B1-B2

BAND-STOP FILTER AND ELECTRONIC DEVICE

CROSS-REFERENCE TO RELATED APPLICATIONS

This application is a continuation of International Application No. PCT/CN2019/113132, filed on Oct. 24, 2019, the disclosure of which is hereby incorporated by reference in its entirety.

TECHNICAL FIELD

This application relates to the field of communications component technologies, and in particular, to a band-stop filter and an electronic device.

BACKGROUND

High-frequency filters are widely used in the modern communications field, and their basic function is to make useful signals pass through a signal link to a maximum extent, and to reject harmful signals to a maximum extent. When classified by function, existing high-frequency filters include band-pass filters, band-stop filters, low-pass filters, high-pass filters, and the like. Band-stop filters are characterized by a high bandwidth, a high rejection degree, and a low loss, and are widely used in the fields of communications and broadband services. A basic feature of the so-called band-stop filters is to ensure that signals of some frequency bands are rejected to a maximum extent while the other signals are allowed to pass to a maximum extent.

However, a current band-stop filter has a relatively large overall size, occupies a relatively large space, and has a relatively large insertion loss. As a result, an industry requirement for a small-size high-performance band-stop filter cannot be met.

SUMMARY

Embodiments of this application provide a band-stop filter and an electronic device, which are used to resolve a problem that a band-stop filter has a large size and a large insertion loss.

To achieve the foregoing objective, the following technical solutions are used in embodiments.

According to a first aspect, a band-stop filter is provided, including: a waveguide transmission line, configured to transmit electromagnetic waves; and a plurality of dielectric resonance units, sequentially arranged along an extension track of the waveguide transmission line, and configured to be coupled to the waveguide transmission line, where the dielectric resonance units each include at least one dielectric resonator; the dielectric resonator includes a first dielectric block and a first conductive layer covering an outer surface of the first dielectric block; and a first surface of the first dielectric block has a blind hole, and the first conductive layer covers an inner surface of the blind hole; where a dielectric constant of a material that forms the first dielectric block is greater than 1. In the band-stop filter provided in embodiments of this application, the dielectric resonator includes the first dielectric block and the first conductive layer covering the outer surface of the first dielectric block, and the dielectric constant of the material that forms the first dielectric block is greater than 1. The dielectric resonator is a resonator formed by a material with a low loss and a large dielectric constant. At a same resonance frequency, a larger dielectric constant indicates a smaller size of the dielectric resonator. Therefore, compared with a band-stop filter in which an air cavity with a small dielectric constant is used to form a resonator in a related technology, the band-stop filter provided in embodiments of this application can reduce a size of the dielectric resonator, thereby reducing a size of the band-stop filter. In addition, because the outer surface of the first dielectric block is covered with the first conductive layer, the first conductive layer seals an electromagnetic wave entering the first dielectric block into the first dielectric block, and the electromagnetic wave does not radiate to free space. Therefore, no radiation loss occurs, and there are only a relatively small dielectric loss and an ohmic loss that is caused by the first conductive layer. Impact on a quality factor of the dielectric resonator is relatively small, and therefore the dielectric resonator has a relatively small loss.

Optionally, the band-stop filter further includes: a coupling channel, disposed between the waveguide transmission line and the dielectric resonator that is in the dielectric resonance unit and that is closest the waveguide transmission line, where the coupling channel communicates with the blind hole in the dielectric resonator; and a second conductive layer, covering an inner surface of the coupling channel. A coupling bandwidth between the waveguide transmission line and the dielectric resonance unit may be adjusted, to implement a larger coupling bandwidth between the waveguide transmission line and the dielectric resonance unit.

Optionally, the waveguide transmission line includes a second dielectric block and a third conductive layer covering an outer surface of the second dielectric block; a first surface of the second dielectric block has a groove, and the groove runs through the waveguide transmission line along the extension track of the waveguide transmission line; and the third conductive layer covers an inner surface of the groove. The waveguide transmission line is a dielectric waveguide transmission line, and the dielectric waveguide transmission line has a groove. This structure can reduce a cut-off frequency of the waveguide transmission line and reduce a size of the waveguide transmission line.

Optionally, the groove is a stepped groove. A characteristic impedance of each transmission line segment is adjusted by adjusting a groove depth on each transmission line segment that is in the waveguide transmission line and that is coupled to each dielectric resonator. In this way, a length of each transmission line segment coupled to each dielectric resonance unit can be reduced, thereby reducing a size of the band-stop filter.

Optionally, a groove in a portion, of the waveguide transmission line, that is coupled to one dielectric resonator has a groove depth of a fixed value. This can reduce design difficulty and process difficulty.

Optionally, the groove is a flat groove. This can simplify a processing process.

Optionally, the coupling channel in the band-stop filter is a coupling groove located between the blind hole and the groove, and the coupling groove includes a first coupling sub-groove and a second coupling sub-groove that communicate with each other; and the first coupling sub-groove is located in the first dielectric block and communicates with the blind hole, and the second coupling sub-groove is located in the second dielectric block and communicates with the groove. The coupling channel is a coupling groove with an opening, which is convenient to prepare.

Optionally, the second conductive layer includes a first conductive sub-layer and a second conductive sub-layer, the first conductive sub-layer covers the first coupling sub-groove, and the second conductive sub-layer covers the second coupling sub-groove. A portion of the first conductive layer serves as the first conductive sub-layer, and a portion of the third conductive layer serves as the second conductive sub-layer. A process for separately preparing the second conductive layer is not required, and a structure is simple.

Optionally, the dielectric resonance unit is located on a side on which a second surface of the waveguide transmission line that intersects the first surface is located; and a groove opening of the coupling groove and a groove opening of the groove are located on a same side of the band-stop filter. In this way, processing of the coupling groove and the groove can be completed on a same side without turning over the band-stop filter, thereby simplifying a process procedure and improving preparation efficiency.

Optionally, the dielectric resonance unit is located on the side on which the second surface of the waveguide transmission line that intersects the first surface is located; and an aperture of the blind hole and the groove opening of the groove are located on a same side of the band-stop filter. In this way, processing of the blind hole and the groove can be completed on a same side without turning over the band-stop filter, thereby simplifying a process procedure and improving preparation efficiency.

Optionally, the dielectric resonance unit and the groove opening of the groove are disposed on different sides. This facilitates processing of the groove.

Optionally, the plurality of dielectric resonance units are distributed on a plurality of sides of the waveguide transmission line, and the dielectric resonance units disposed on different sides are staggered.

Optionally, a groove bottom of the groove has a through hole that runs through the waveguide transmission line along a groove depth direction of the groove, and an inner surface of the through hole is covered with a fourth conductive layer; a conductive column is disposed inside the through hole, and an end of the conductive column that is away from the groove extends to an outside of the through hole; and both the third conductive layer and the fourth conductive layer are insulated from the conductive column. The conductive column may be directly electrically connected to an external component, to implement integration of the band-stop filter with the external component.

Optionally, the waveguide transmission line and the plurality of dielectric resonance units are an integrated structure. This can simplify a preparation process.

Optionally, a material of the first dielectric block is ceramic. Ceramic has a large dielectric constant and a small loss. Therefore, the first dielectric block has a small size at a same resonance frequency.

Optionally, a material of the second dielectric block is ceramic. Ceramic has a large dielectric constant and a small loss. Therefore, the second dielectric block has a small size at a same resonance frequency.

Optionally, the waveguide transmission line is a metal line; and the waveguide transmission line is disposed on a surface of the dielectric resonance unit; and the first conductive layer is insulated from the waveguide transmission line. When the waveguide transmission line is a coplanar waveguide transmission line, the size of the waveguide transmission line is smaller.

Optionally, the band-stop filter further includes open-circuit stubs, and portions in the waveguide transmission line serve as the open-circuit stubs; and one of the open-circuit stubs is coupled to one of the dielectric resonance units. The open-circuit stub and the dielectric resonance unit may form a capacitive coupling structure, so as adjust a coupling bandwidth between the waveguide transmission line and the dielectric resonance unit.

Optionally, the waveguide transmission line is located on a side on which a second surface of the dielectric resonance unit that intersects the first surface is located; and the coupling channel in the band-stop filter is a coupling hole located in the first dielectric block, and an aperture of the coupling hole is located on the open-circuit stub. The coupling hole may be formed on a side on which the waveguide transmission line is located. The preparation process is simple.

Optionally, the waveguide transmission line is located on a side on which a second surface of the dielectric resonance unit that intersects the first surface is located; and the coupling channel is a coupling hole located in the first dielectric block, and an aperture of the coupling hole is located on the waveguide transmission line.

Optionally, a portion of the first conductive layer serves as the second conductive layer.

Optionally, the aperture of the blind hole and the waveguide transmission line are disposed on different surfaces. The aperture of the blind hole does not affect preparation of the waveguide transmission line, thereby reducing preparation process difficulty of the waveguide transmission line.

Optionally, the waveguide transmission line is a bent line. Provided that a total length of the waveguide transmission line is unchanged, a length of the band-stop filter can be reduced by bending the waveguide transmission line.

Optionally, the plurality of dielectric resonance units are an integrated structure. In the plurality of dielectric resonance units, a separation opening is disposed between at least one group of adjacent dielectric resonance units. This can reduce an occupied area of the plurality of dielectric resonance units.

According to a second aspect, an electronic device is provided, including the band-stop filter according to any implementation of the first aspect.

Optionally, the electronic device further includes a printed circuit board; and a conductive column in the band-stop filter is electrically connected to the printed circuit board. The band-stop filter can be directly integrated on the printed circuit board.

Optionally, the electronic device further includes a printed circuit board; and a waveguide transmission line in the band-stop filter is a metal line, and the waveguide transmission line is electrically connected to the printed circuit board. The band-stop filter can be directly integrated on the printed circuit board.

Optionally, the electronic device further includes a connector; and the connector is electrically connected to the conductive column. The band-stop filter may be inserted into a required location by using the connector, and is applicable as an external anti-interference filter. The band-stop filter can be miniaturized compared with an anti-interference filter with a metal cavity in a related technology.

Optionally, the electronic device further includes a connector; and a waveguide transmission line in the band-stop filter is a metal line, and the connector is electrically connected to the waveguide transmission line. The band-stop filter may be inserted into a required location by using the connector, and is applicable as an external anti-interference filter. The band-stop filter can be miniaturized compared with an anti-interference filter with a metal cavity in a related technology.

DESCRIPTION OF EMBODIMENTS

Unless otherwise specified, technical terms or scientific terms used in this application shall have ordinary meanings understood by a person skilled in the art. The terms "first", "second", "third", and similar expressions used in the specification and claims of this application do not indicate any order, quantity, or importance, but are merely used to distinguish between different components. Therefore, a feature defined by "first", "second", or "third" may explicitly or implicitly include one or more such features. In the descriptions of embodiments of this application, unless otherwise specified, "a plurality of" means two or more than two.

Orientation terms such as "left", "right", "upper" and "lower" are defined relative to orientations at which components in the accompanying drawings are schematically placed. It should be understood that, these directional terms are relative concepts and are used for relative description and clarification, and may vary accordingly with the orientations at which the components are placed.

An embodiment of this application provides an electronic device. The electronic device may be a terminal device that has a display interface, such as a mobile phone, a television, a display, a tablet computer, or an in-vehicle computer, or may be an intelligent display wearable device such as a smartwatch or a smart band, or may be a communications device such as a server, a memory, or a base station (a small base station or a large base station), or may be a smart car, or the like. A specific form of the electronic device is not specially limited in embodiments of this application. For ease of description, an example in which the electronic device is a base station is used for description in the following embodiments.

Figure 1:
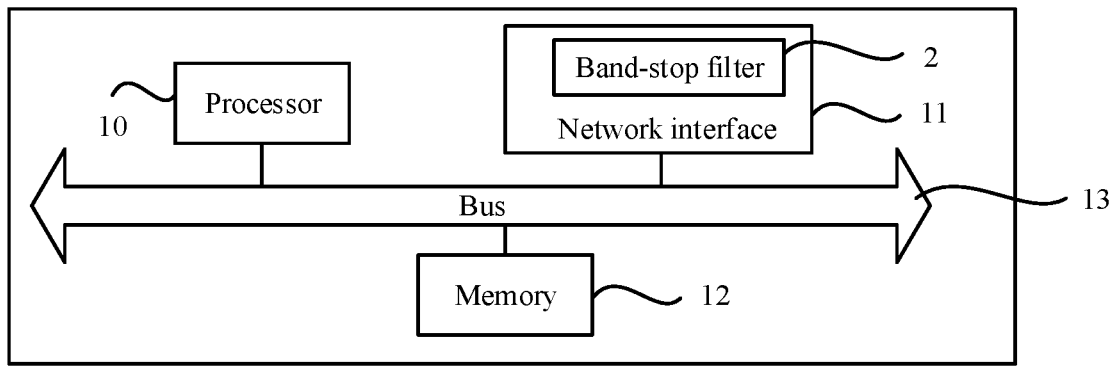
FIG. 1 is a schematic diagram of a framework of an electronic device according to an embodiment of this application.

FIG. 1 is a schematic diagram of a structure of an electronic device 100 according to an embodiment of this application. As shown in FIG. 1, the electronic device 100 mainly includes at least one processor 10 (for example, a central processing unit), at least one network interface (wired or wireless) 11, a memory 12, and at least one bus 13. The memory 12 and the network interface 11 are separately connected to the processor 10 by using the bus 13, and are configured to implement connection and communication.

The memory 12 may be a read-only memory (ROM) or another type of static storage device that can store static information and instructions, or a random access memory (RAM) or another type of dynamic storage device that can store information and instructions; or may be an electrically erasable programmable read-only memory (EEPROM), a compact disc read-only memory (CD-ROM), another compact disc storage, optical disc storage (including a compact disc, a laser disc, an optical disc, a digital versatile disc, a Blu-ray optical disc, and the like), or magnetic disk storage medium, another magnetic storage device, or any other medium that can be used to carry or store expected program code in a form of instructions or a data structure and that can be accessed by a computer. This is not limited in embodiments of this application. The memory 12 may exist independently, or may be integrated with the processor 10. The memory 12 may include computer program code.

The processor 10 is configured to execute the computer program code stored in the memory 12. The processor 10 may be a general-purpose central processing unit (CPU), an application-specific integrated circuit (ASIC), a microprocessor, or one or more integrated circuits configured to control program execution in the solutions of this application. The processor 10 may be a single-core (single-CPU) processor, or may be a multi-core (multi-CPU) processor.

The bus 13 is configured to implement interconnection between the processor 10, the memory 12, and the network interface 11. The at least one network interface 11 is used to implement the communication and connection between the electronic device 100 and at least one network element.

In some implementations, as shown in FIG. 1, the network interface 11 in the electronic device 100 further includes a band-stop filter (BSF) 2. The band-stop filter 2 is configured to enable an electromagnetic wave of a required frequency band in electromagnetic waves to pass at a low loss, without performing relatively large attenuation on the electromagnetic wave of the required frequency band, to avoid interference.

Figure 2A:
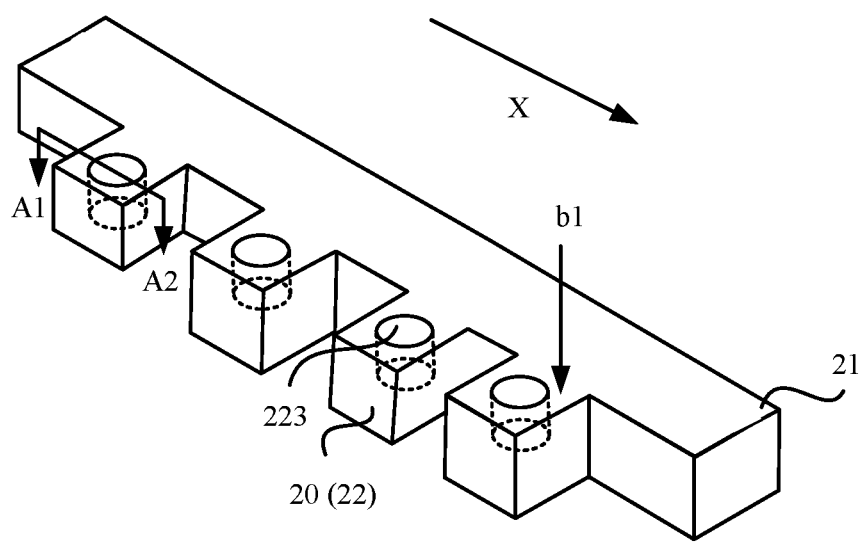
FIG. 2A is a schematic diagram of a structure of a band-stop filter according to an embodiment of this application.

A structure of the band-stop filter 2 is shown in FIG. 2A, and the band-stop filter 2 includes a waveguide transmission line 21 and a plurality of dielectric resonance units 20.

The waveguide transmission line 21 is configured to transmit electromagnetic waves. The electromagnetic waves transmitted by the waveguide transmission line 21 include electromagnetic waves at a plurality of frequencies.

For example, the waveguide transmission line 21 may be a dielectric waveguide transmission line, a coplanar waveguide transmission line, or the like.

The plurality of dielectric resonance units 20 are sequentially arranged along an extension track X of the waveguide transmission line 21, and each dielectric resonance unit 20 is configured to be coupled to the waveguide transmission line 21 to filter out an electromagnetic wave in a specified frequency range.

In the electronics and telecommunications fields, coupling refers to a process in which energy propagates from one medium (for example, a metal line or a light-guide fiber) to another medium. The dielectric resonance unit 20 is configured to be coupled to the waveguide transmission line 21, and this refers to a process in which an electromagnetic wave in the waveguide transmission line 21 propagates from the waveguide transmission line 21 to the dielectric resonance unit 20. After being reflected by the dielectric resonance unit 20, the electromagnetic wave in the specified frequency range in the electromagnetic waves transmitted by the waveguide transmission line 21 can no longer be transmitted forward, thereby achieving an effect of filtering out the electromagnetic wave in the specified frequency range.

The foregoing specified frequency range means that, when a structure of the dielectric resonance unit 20 is designed, the dielectric resonance unit 20 is directly disposed as required as a structure capable of filtering out an electromagnetic wave in a fixed frequency range. In the plurality of dielectric resonance units 20, frequency ranges of electromagnetic waves that can be filtered out by the dielectric resonance units 20 may be the same or different.

For a quantity of dielectric resonators 22 in the dielectric resonance unit 20, in a possible embodiment, as shown in FIG. 2A, the dielectric resonance unit 20 includes one dielectric resonator 22.

In this way, difficulty of a preparation process can be reduced, and a width of the band-stop filter 2 in a direction perpendicular to a track direction of the waveguide transmission line 21 can be reduced.

Figure 2B:
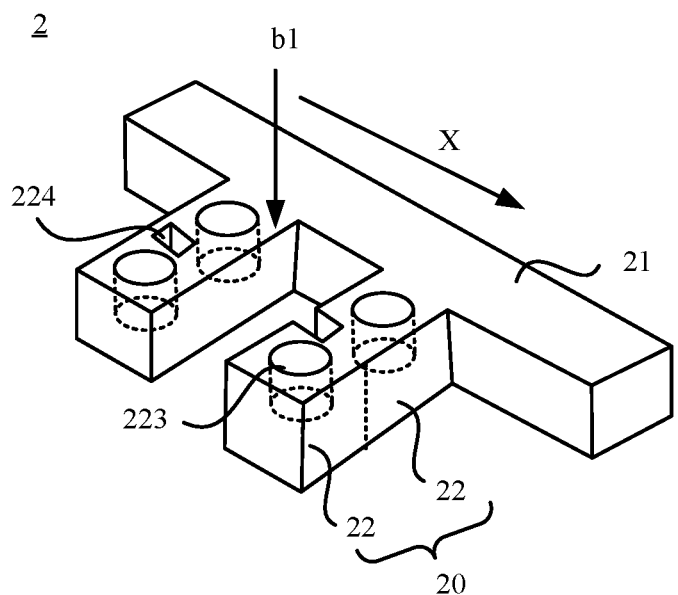
FIG. 2B is a schematic diagram of a structure of another band-stop filter according to an embodiment of this application.

In another possible embodiment, as shown in FIG. 2B, the dielectric resonance unit 20 includes a plurality of dielectric resonators 22.

A separation opening 224 may be disposed between adjacent dielectric resonators 22, to reduce a coupling window between the adjacent dielectric resonators 22, thereby adjusting coupling strength between the adjacent dielectric resonators 22.

In addition, because the plurality of dielectric resonance units 20 are sequentially arranged along the track direction of the waveguide transmission line 21, only one dielectric resonator 22 in each dielectric resonance unit 20 is directly disposed close to the waveguide transmission line 21, and a remaining dielectric resonator 22 is arranged along a direction away from the waveguide transmission line 21.

Provided that the band-stop filter 2 includes a same quantity (for example, four) of dielectric resonators 22, compared with the structure of the dielectric resonance unit 20 including one dielectric resonator 22 shown in FIG. 2A, the structure of the dielectric resonance unit 20 including a plurality of dielectric resonators 22 shown in FIG. 2B can reduce a track length of the waveguide transmission line 21.

Figure 2C:
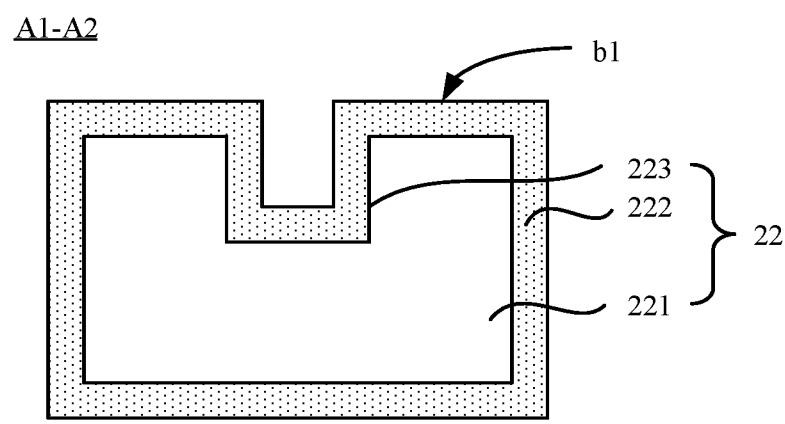
FIG. 2C is a cross-sectional view along an A1-A2 direction in FIG. 2A.

The dielectric resonator 22 is a type of resonator prepared by using a material with a low loss and a large dielectric constant. As shown in FIG. 2C (a cross-sectional view along an A1-A2 direction in FIG. 2A), the dielectric resonator 22 includes a first dielectric block 221 and a first conductive layer 222 covering an outer surface of the first dielectric block 221. The first dielectric block 221 is configured to conduct an electromagnetic wave, and the first conductive layer 222 is configured to shield an electromagnetic wave.

A shape of the first dielectric block 221 may be, for example, rectangular or cylindrical. A dielectric constant of a material that forms the first dielectric block 221 is greater than 1 (a dielectric constant of air is equal to 1), and the material of the first dielectric block 221 may be, for example, barium titanate, titanium dioxide, or ceramic. A material that forms the first conductive layer 222 may be a metal, for example, silver, and the first conductive layer 222 may be formed by using a surface metallization process.

It should be noted that, at a same resonance frequency, a larger dielectric constant of the material that forms the first dielectric block 221 indicates a smaller size of the first dielectric block 221.

As shown in FIG. 2C, a first surface of the first dielectric block 221 has a blind hole 223, the first conductive layer 222 covers an inner surface of the blind hole 223, and a location of an aperture is still exposed. That is, an inner wall of the blind hole 223 is covered with the first conductive layer 222.

A side on which the first surface of the first dielectric block 221 is located is a side on which a first surface b1 of the dielectric resonator 22 is located, that is, a side on which the first surface b1 of the dielectric resonance unit 20 is located.

The extension track X of the waveguide transmission line 21 may be a straight line, or may be a bent line.

Figure 2D:
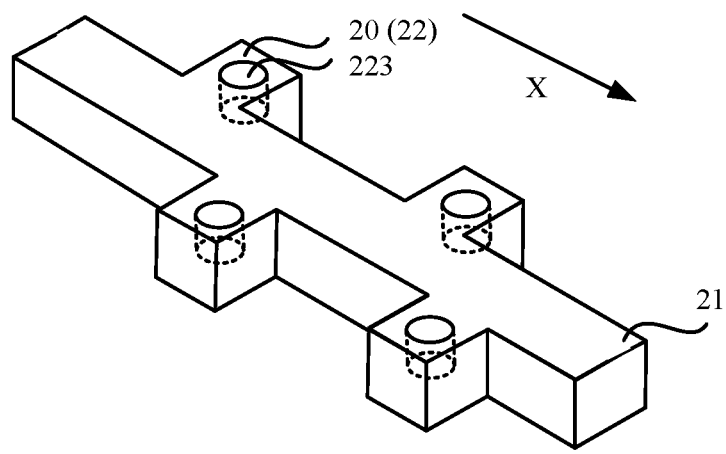
FIG. 2D is a schematic diagram of a structure of still another band-stop filter according to an embodiment of this application.

The sequential arrangement of the plurality of dielectric resonance units 20 along the extension track X of the waveguide transmission line 21 is not limited to a straight-line sequential arrangement shown in FIG. 2A, and may alternatively be a bent-line sequential arrangement shown in FIG. 2D or a spiral sequential arrangement, provided that phases of the plurality of dielectric resonance units 20 are staggered so that each transmission line segment on the waveguide transmission line X is coupled to one dielectric resonance unit 20.

In the band-stop filter 2 provided in this embodiment of this application, the dielectric resonator 22 includes the first dielectric block 221 and the first conductive layer 222 covering the outer surface of the first dielectric block 221, and the dielectric constant of the material that forms the first dielectric block 221 is greater than 1. The dielectric resonator 22 is a resonator formed by a material with a low loss and a large dielectric constant. At a same resonance frequency, a larger dielectric constant indicates a smaller size of the dielectric resonator 22. Therefore, compared with a band-stop filter in which an air cavity with a small dielectric constant is used to form a resonator in a related technology, the band-stop filter 2 provided in this embodiment of this application can reduce a size of the dielectric resonator 22, thereby reducing a size of the band-stop filter 2. Moreover, a structure of the blind hole 223 sinks into the first dielectric block 221, so that the size of the dielectric resonator 22 can be further reduced when a resonance frequency requirement is met.

In addition, because the outer surface of the first dielectric block 221 is covered with the first conductive layer 222, the first conductive layer 222 seals an electromagnetic wave entering the first dielectric block 221 into the first dielectric block 221, and the electromagnetic wave does not radiate to free space. Therefore, no radiation loss occurs, and there are only a relatively small dielectric loss and an ohmic loss that is caused by the first conductive layer 222. Impact on a quality factor Q of the dielectric resonator 22 is relatively small, and therefore the dielectric resonator 22 has a relatively small loss.

The following provides an example description on the structure of the band-stop filter 2 provided in this embodiment of this application by using several detailed embodiments.

Embodiment 1

Figure 3A:
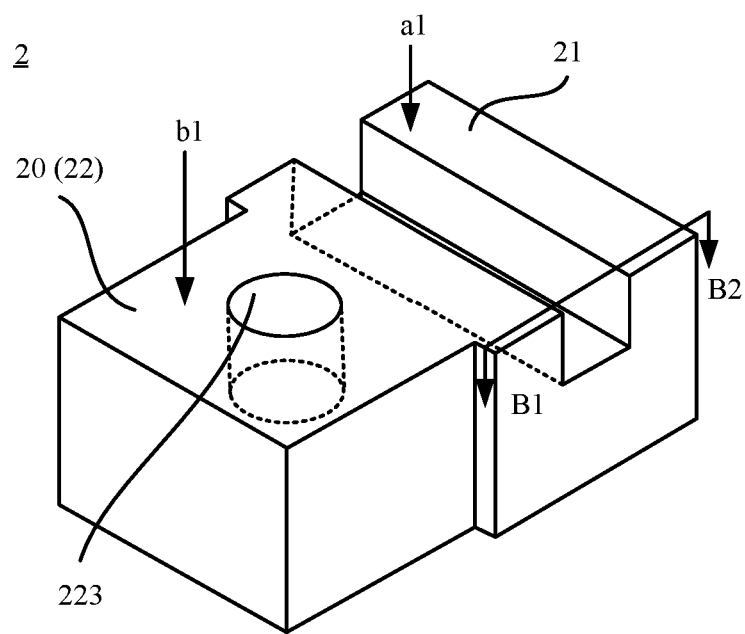
FIG. 3A is a schematic diagram of a structure of still another band-stop filter according to an embodiment of this application.

As shown in FIG. 3A, the band-stop filter 2 includes a waveguide transmission line 21 and a plurality of dielectric resonance units 20 (one dielectric resonance unit 20 is used as an example in FIG. 3A).

Figure 3B:
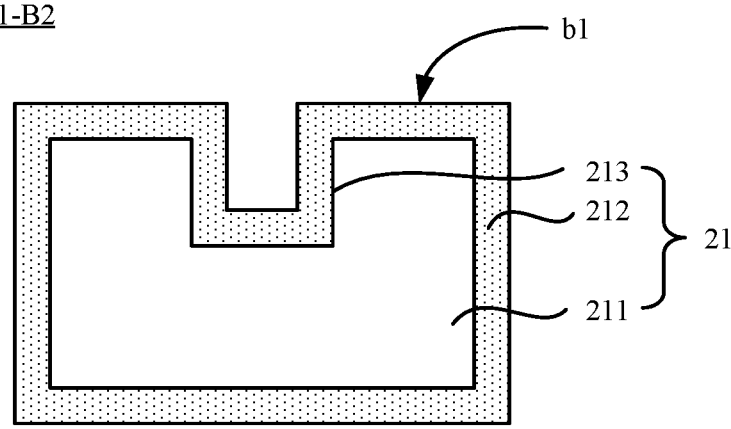
FIG. 3B is a cross-sectional view along a B1-B2 direction in FIG. 3A.

The waveguide transmission line 21 is a dielectric waveguide transmission line, for example, a dielectric ridge waveguide transmission line. As shown in FIG. 3B (a cross-sectional view along a B1-B2 direction in FIG. 3A), the waveguide transmission line 21 includes a second dielectric block 211 and a third conductive layer 212 covering an outer surface of the second dielectric block 211. The second dielectric block 211 is configured to conduct an electromagnetic wave, and the third conductive layer 212 is configured to shield an electromagnetic wave.

A shape of the second dielectric block 211 is also a shape of the waveguide transmission line 21, and the shape of the second dielectric block 211 is not limited.

Figure 4A:
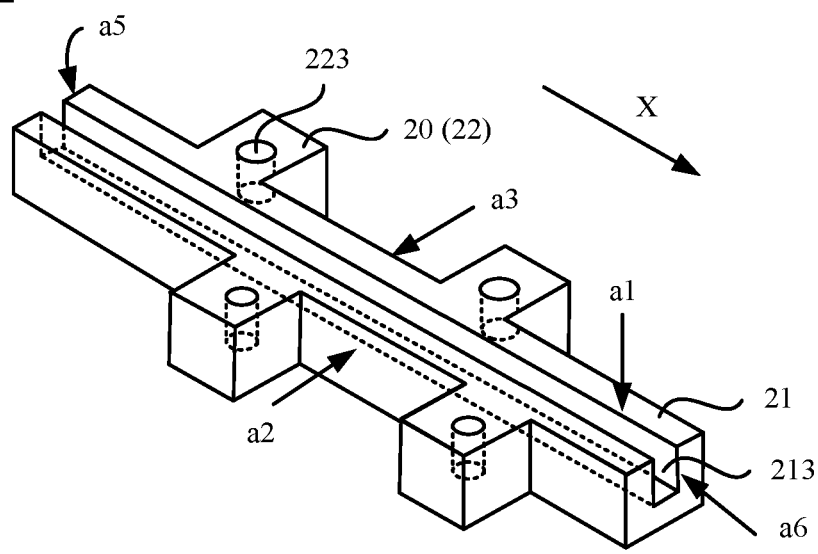
FIG. 4A is a schematic diagram of a structure of still another band-stop filter according to an embodiment of this application.

To reduce process difficulty, in a possible embodiment, as shown in FIG. 4A, the waveguide transmission line 21 is a straight line.

Figure 4B:
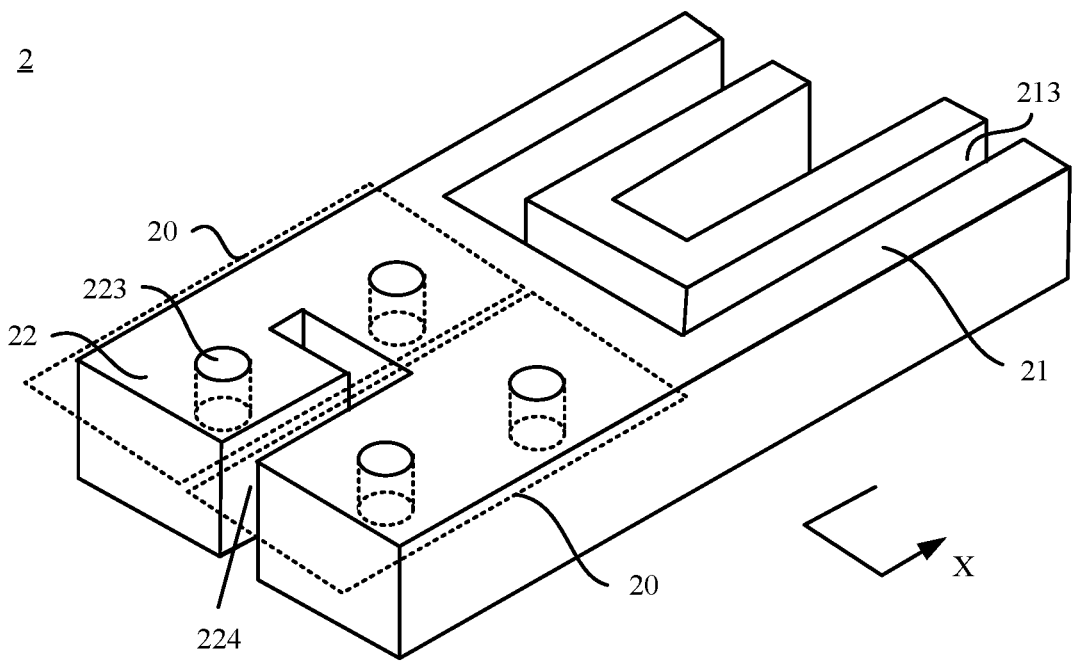
FIG. 4B is a schematic diagram of a structure of still another band-stop filter according to an embodiment of this application.
Figure 4C:
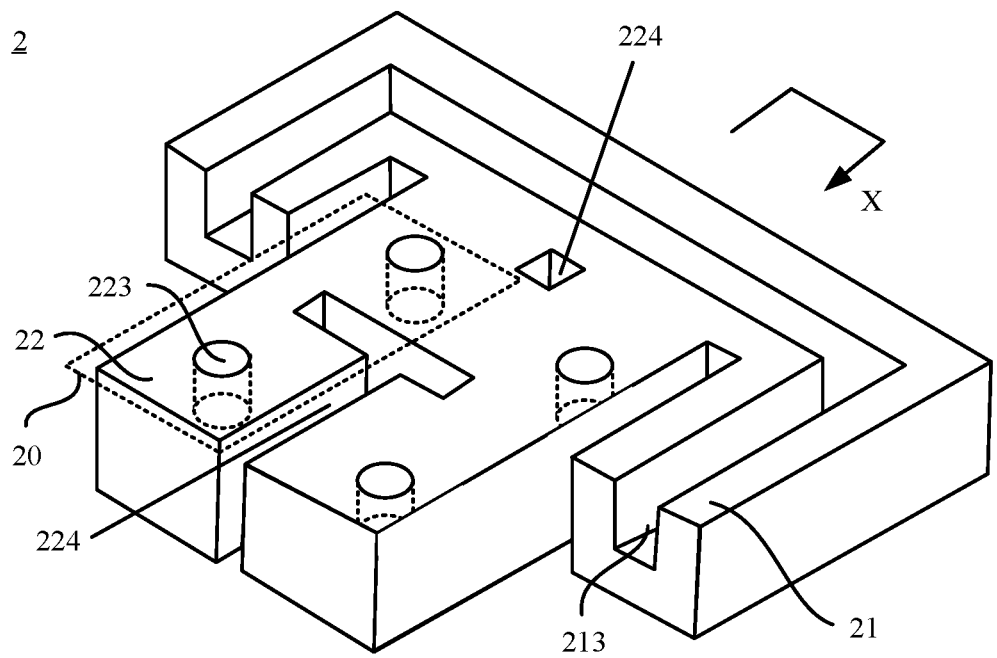
FIG. 4C is a schematic diagram of a structure of still another band-stop filter according to an embodiment of this application.

To reduce a length of the waveguide transmission line 21, in another possible embodiment, as shown in FIG. 4B and FIG. 4C, the waveguide transmission line 21 is a bent line.

Optionally, the waveguide transmission line 21 is a bent line with a corner of 90°, or it is understood that a bent-line corner formed by two adjacent segments of the waveguide transmission line 21 is 90°.

As shown in FIG. 4B and FIG. 4C, relative locations of the dielectric resonance unit 20 and the waveguide transmission line 21 vary with a bent-line shape. Regardless of a specific arrangement, when the dielectric resonance unit 20 includes a plurality of dielectric resonators 22, only one dielectric resonator 22 in the dielectric resonance unit 20 is disposed close to the waveguide transmission line 21. In other words, the plurality of dielectric resonators 22 included in the dielectric resonance unit 20 are sequentially arranged in a direction away from the waveguide transmission line 21.

In addition, in this embodiment of this application, a dielectric constant of a material that forms the second dielectric block 211 is greater than 1, the material of the second dielectric block 211 may be, for example, barium titanate, titanium dioxide, or ceramic, and the material of the second dielectric block 211 may be the same as a material of a first dielectric block 221. For example, a material that forms the third conductive layer 212 may be a metal, and the material of the third conductive layer 212 may be the same as a material of a first conductive layer 222.

For ease of description, the following provides a schematic description by using an example in which one dielectric resonance unit 20 includes one dielectric resonator 22.

To reduce a cut-off frequency of the waveguide transmission line 21 to increase an application range of the band-stop filter 2, in a possible embodiment, a size of the waveguide transmission line 21 is increased.

Because a cut-off frequency of a waveguide is subject to factors such as a size of the waveguide transmission line 21 and the material of the second dielectric block 211, when the material of the second dielectric block 211 is fixed, the cut-off frequency of the waveguide transmission line 21 can be adjusted by adjusting the size of the waveguide transmission line 21.

In another possible embodiment, as shown in FIG. 3B, a first surface of the second dielectric block 211 has a groove 213, and the third conductive layer 212 covers an inner surface of the groove 213.

A side on which the first surface of the second dielectric block 211 is located is a side on which a first surface a1 of the waveguide transmission line 21 is located.

As shown in FIG. 4A, FIG. 4B, and FIG. 4C, the groove 213 runs through the waveguide transmission line 21 along an extension track X of the waveguide transmission line 21.

As shown in FIG. 4A, the groove 213 runs through the waveguide transmission line 21 along the extension track X of the waveguide transmission line 21. It can be understood that, the groove 213 has three openings. One opening is located on the first surface a1, and is opposite to a groove bottom of the groove 213. The other two openings are respectively located on a fifth surface a5 and a sixth surface a6 that intersect the first surface a1 and that are located at a head and a tail of the waveguide transmission line 21. The other two openings separately intersect the groove bottom of the groove 213, and the two openings are disposed opposite to each other.

A direction of an electric field in the waveguide transmission line 21 is parallel to a groove depth direction of the groove 213. Forming the groove 213 on the first surface of the second dielectric block 211 is equivalent to having an effect of loading a capacitor. In this way, the waveguide transmission line 21 has a relatively low cut-off frequency without increasing the size of the transmission line 21.

For a structure of the groove 213, in a possible embodiment, as shown in FIG. 4A, the groove 213 is a flat groove, that is, locations in the groove 213 have a same groove depth.

In this case, impedance transformation of each dielectric resonator 22 may be adjusted by adjusting a length of each transmission line segment that is in the waveguide transmission line 21 and that is coupled to each dielectric resonator 22.

Figure 5A:
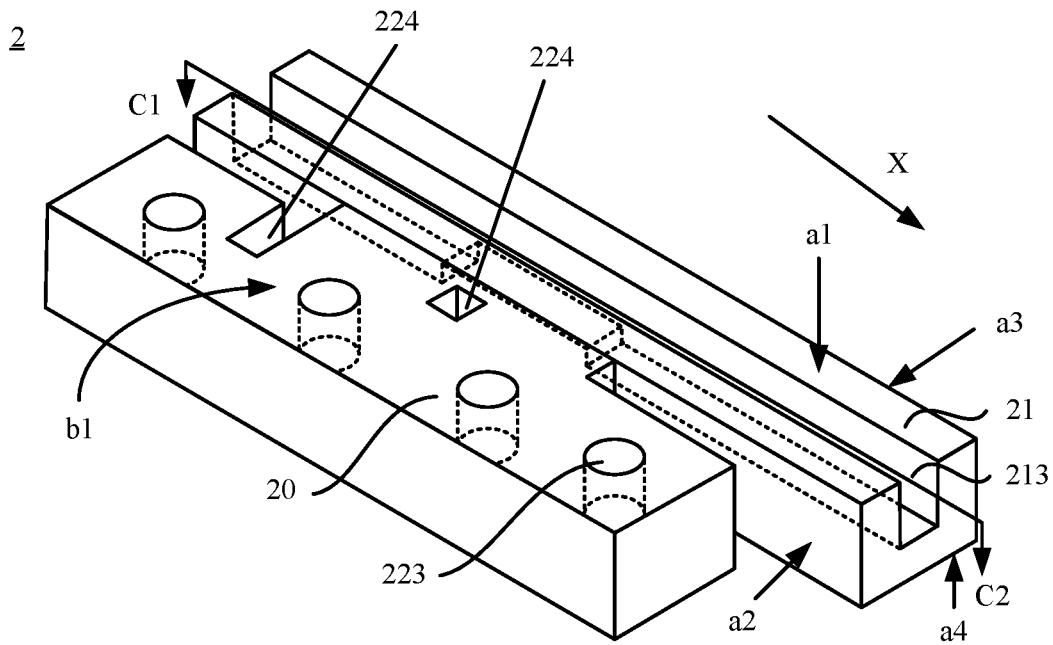
FIG. 5A is a schematic diagram of a structure of still another band-stop filter according to an embodiment of this application.

For the structure of the groove 213, in another possible embodiment, as shown in FIG. 5A, the groove 213 is a stepped groove, that is, not all locations in the groove 213 have a same groove depth.

Figure 5B:
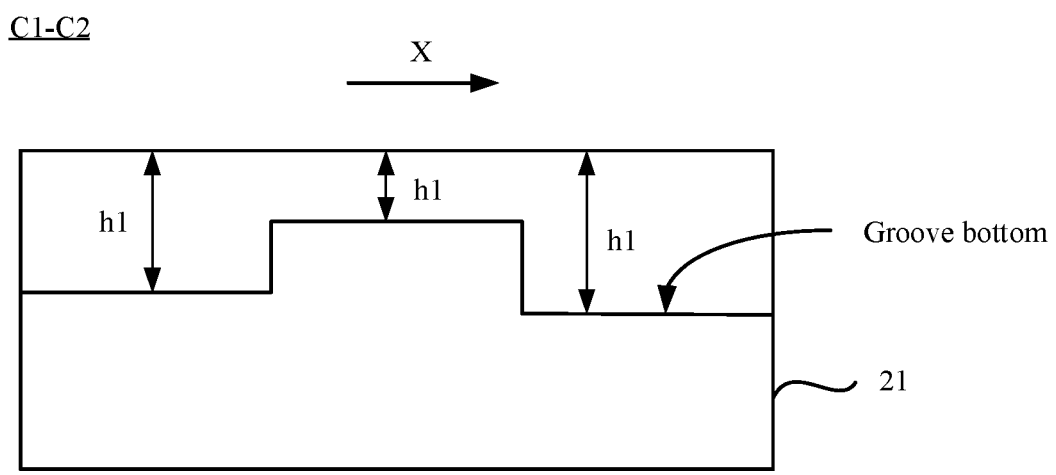
FIG. 5B is a cross-sectional view along a C1-C2 direction in FIG. 5A.

For a structure of the stepped groove, in some embodiments, as shown in FIG. 5B (a cross-sectional view along a C1-C2 direction in FIG. 5A), groove depths hl of locations along the extension track X of the waveguide transmission line 21 are designed based on a requirement and are irregular, provided that not all locations of the groove 213 have a same groove depth hl.

Figure 5C:
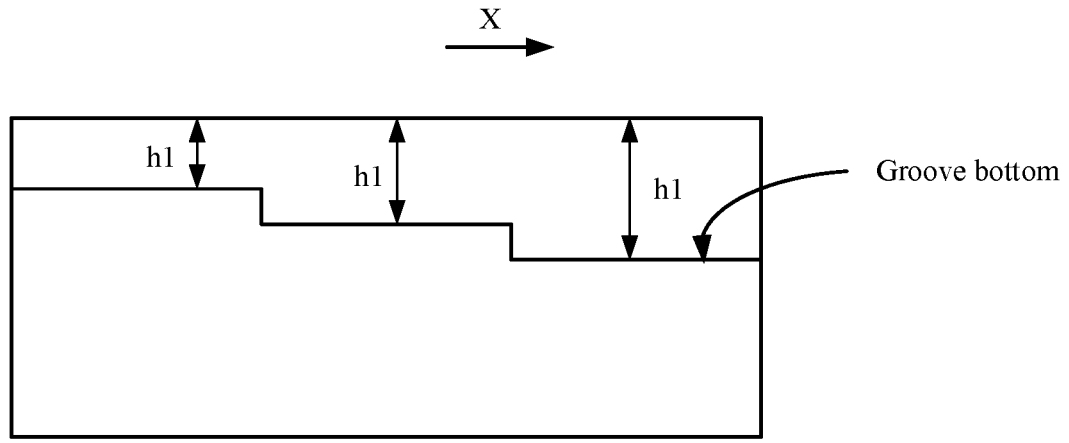
FIG. 5C is a schematic diagram of a structure of groove depths of a groove according to an embodiment of this application.

Alternatively, for a structure of the stepped groove, in some embodiments, as shown in FIG. 5C, groove depths hl of locations along the extension track X of the waveguide transmission line 21 increase successively.

Figure 5D:
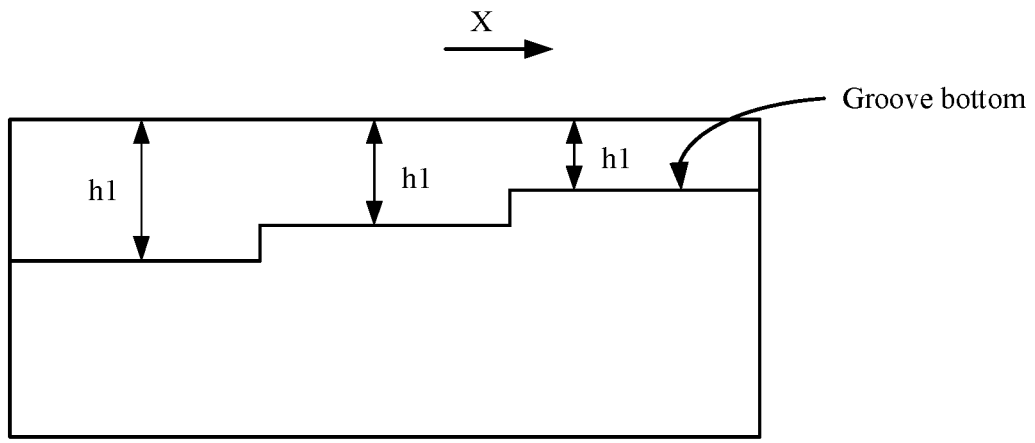
FIG. 5D is a schematic diagram of a structure of groove depths of another groove according to an embodiment of this application.

Alternatively, for a structure of the stepped groove, in some embodiments, as shown in FIG. 5D, groove depths hl of locations along the extension track X of the waveguide transmission line 21 decrease successively.

To reduce design difficulty and process difficulty, in some embodiments, the groove 213 in a portion, of the waveguide transmission line 21, that is coupled to one dielectric resonance unit 20 has a groove depth hl of a fixed value.

That is, a groove depth hl on each transmission line segment coupled to each dielectric resonance unit 20 is a fixed value, but groove depths hl on adjacent transmission line segments are not necessarily equal.

In this case, a characteristic impedance of each transmission line segment is adjusted by adjusting the groove depth hl on each transmission line segment that is in the waveguide transmission line 21 and that is coupled to each dielectric resonance unit 20. In this way, a length of each transmission line segment coupled to each dielectric resonance unit 20 can be reduced, thereby reducing a size of the band-stop filter 2.

The dielectric resonator 22 includes the first dielectric block 221 and the first conductive layer 222 covering an outer surface of the first dielectric block 221.

When a resonance frequency of the dielectric resonator 22 is relatively low, as shown in FIG. 5A, the dielectric resonator 22 further includes a blind hole 223 disposed on the first surface of the first dielectric block 221, to avoid increasing a size of the dielectric resonator 22.

For a location of the blind hole 223, in a possible embodiment, as shown in FIG. 5A, a first surface b1, of the dielectric resonance unit 20, on which an aperture of the blind hole 223 is located is parallel to the first surface a1 of the waveguide transmission line, and the first surface b1 and the first surface a1 are located on a same side of the band-stop filter 2.

That is, the aperture of the blind hole 223 and a groove opening of the groove 213 are located on a same side of the band-stop filter 2. In this way, processing of the blind hole 223 and the groove 213 can be completed on a same side without turning over the band-stop filter 2, thereby simplifying a process procedure and improving preparation efficiency.

Figure 6A:
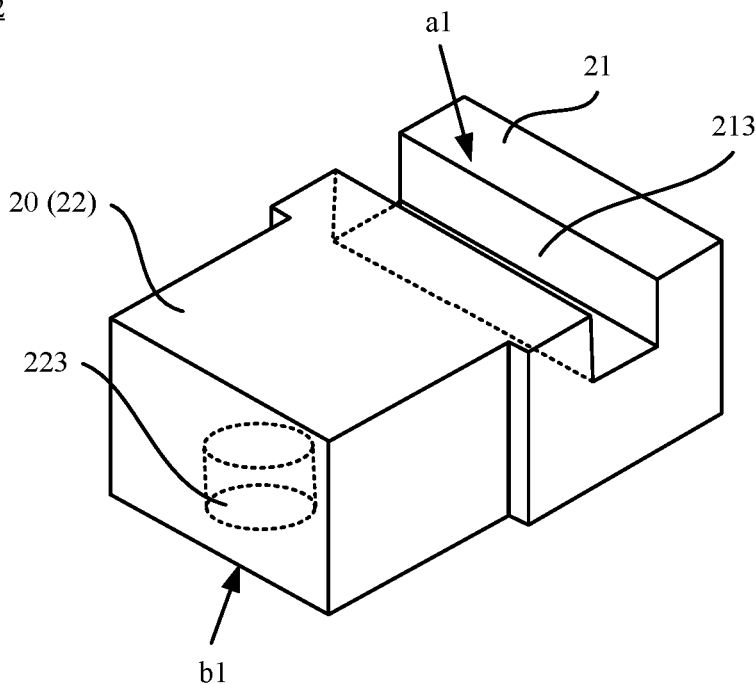
FIG. 6A is a schematic diagram of a structure of still another band-stop filter according to an embodiment of this application.

For a location of the blind hole 223, in another possible embodiment, as shown in FIG. 6A, a first surface b1, of the dielectric resonance unit 20, on which an aperture of the blind hole 223 is located is parallel to the first surface a1 of the waveguide transmission line, but the first surface b1 and the first surface a1 are located on two opposite sides of the band-stop filter 2.

That is, the aperture of the blind hole 223 and a groove opening of the groove 213 are located on two opposite sides of the band-stop filter 2.

Figure 6B:
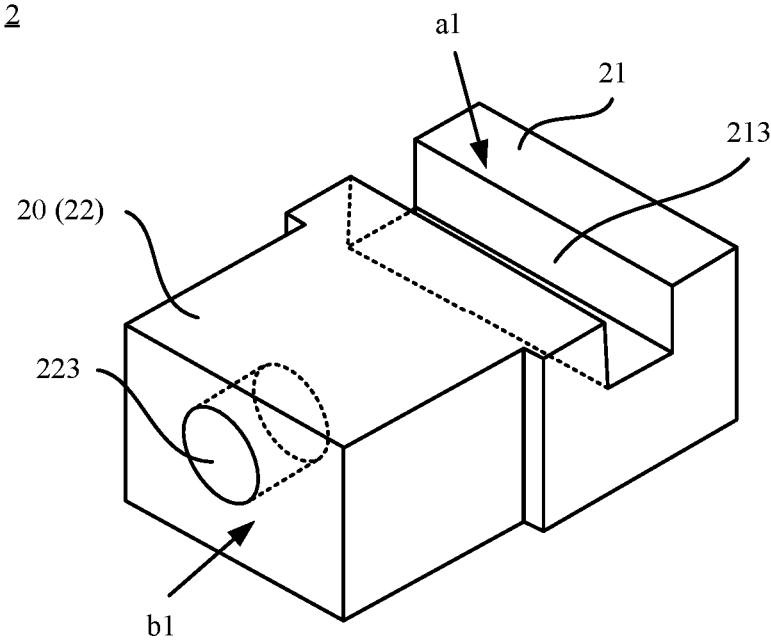
FIG. 6B is a schematic diagram of a structure of still another band-stop filter according to an embodiment of this application.

For a location of the blind hole 223, in another possible embodiment, as shown in FIG. 6B, a first surface b1, of the dielectric resonance unit 20, on which an aperture of the blind hole 223 is located intersects the first surface a1 of the waveguide transmission line, and the first surface b1 and the first surface a1 are located on two intersecting sides of the band-stop filter 2.

Forming the blind hole 223 in the first dielectric block 221 is equivalent to having an effect of loading a capacitor, so that the resonance frequency of the dielectric resonator 22 can be adjusted.

Based on this, a depth of the blind hole 223 may be set based on a resonance frequency required by the dielectric resonator 22. Depths of the blind holes 223 in the dielectric resonators 22 are the same, partially the same, or totally different.

In addition, the blind hole 223 may be a circular hole, a square hole, or a hole of another shape.

For a location relationship between the blind hole 223 and the groove 213, a smaller distance indicates stronger electric field coupling and a larger coupling bandwidth. Therefore, a distance between the blind hole 223 and the groove 213 is related to a coupling bandwidth between the waveguide transmission line 21 and the dielectric resonator 22. Therefore, the coupling bandwidth between the waveguide transmission line 21 and the dielectric resonator 22 is adjusted by adjusting the distance between the blind hole 223 and the groove 213, to meet a requirement.

When coupling strength between two adjacent dielectric resonators 22 in the plurality of dielectric resonators 22 is relatively high and a requirement cannot be met, to reduce the coupling strength between the adjacent dielectric resonators 22, in a possible embodiment, as shown in FIG. 2A, the plurality of dielectric resonance units 20 are independent structures, and a coupling window between adjacent dielectric resonance units 20 is reduced by enlarging a gap between the adjacent dielectric resonance units 20, thereby reducing coupling strength between the adjacent dielectric resonance units 20.

A size of the gap between the adjacent dielectric resonance units 20 varies with the coupling strength between the adjacent dielectric resonance units 20.

To reduce an occupied area of the plurality of dielectric resonance units 20, in another possible embodiment, as shown in FIG. 5A, dielectric resonance units 20 located on a same side of the waveguide transmission line 21 are an integrated structure.

When the plurality of dielectric resonance units 20 are an integrated structure, a separation opening 224 may also be disposed between adjacent dielectric resonance units 20, to reduce a coupling window between the adjacent dielectric resonance units 20, thereby reducing coupling strength between the adjacent dielectric resonance units 20.

As shown in FIG. 5A, the separation opening 224 forms a gap between the adjacent dielectric resonance units 20, and a size and a shape of the separation opening 224 vary with the coupling strength between the adjacent dielectric resonance units 20.

It can be understood that, the separation opening 224 is equivalent to an opening structure that is formed on the first dielectric block 221 and that runs through the first dielectric block 221, and the first conductive layer 222 covers the opening structure on the first dielectric block 221, thereby forming the separation opening 224. Therefore, an inner surface of the separation opening 224 is formed by a portion of the first conductive layer 222.

For a relative location relationship between the plurality of dielectric resonance units 20 and the waveguide transmission line 21, in some embodiments, the plurality of dielectric resonance units 20 and the groove opening of the groove 213 are disposed on different sides.

That is, the plurality of dielectric resonance units 20 are not disposed on the side on which the first surface a1 of the waveguide transmission line 21 is located.

As shown in FIG. 5A, for example, the waveguide transmission line 21 is a rectangular strip having a groove on the first surface a1. Surfaces of the waveguide transmission line 21 that are parallel to the extension track X of the waveguide transmission line 21 include the first surface a1, a second surface a2, a third surface a3, and a fourth surface a4. The fourth surface a4 and the first surface a1 are disposed opposite to each other. The second surface a2 and the third surface a3 are disposed opposite to each other and separately intersect the first surface a1.

Figure 7A:
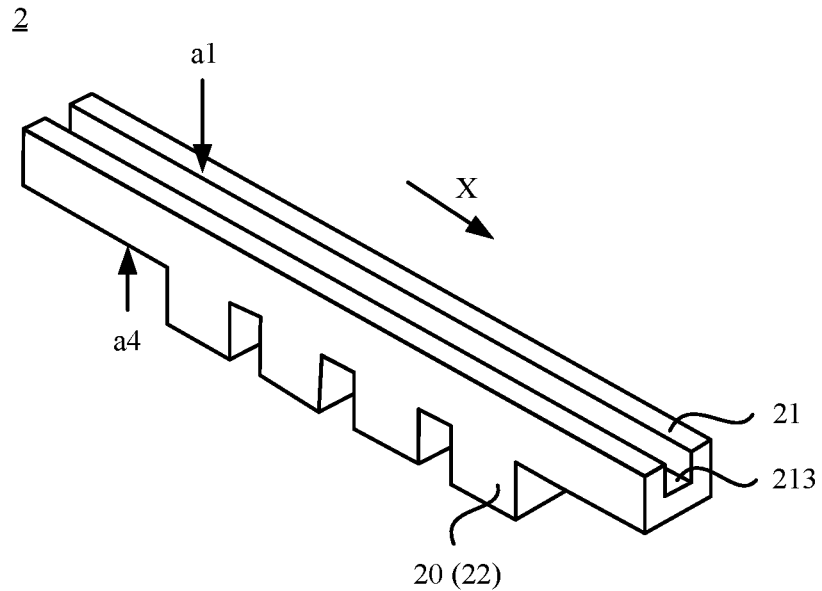
FIG. 7A is a schematic diagram of a structure of still another band-stop filter according to an embodiment of this application.

In a possible embodiment, as shown in FIG. 7A, the plurality of dielectric resonance units 20 are located on a same side of the waveguide transmission line 21.

Optionally, as shown in FIG. 7A, the plurality of dielectric resonance units 20 are located on a side on which the fourth surface a4 of the waveguide transmission line 21 is located.

Optionally, as shown in FIG. 5A, the plurality of dielectric resonance units 20 are located on a side on which the second surface a2 of the waveguide transmission line 21 is located.

Alternatively, optionally, the plurality of dielectric resonance units 20 are located on a side on which the third surface a3 of the waveguide transmission line 21 is located.

In another possible embodiment, the plurality of dielectric resonance units 20 are distributed on at least two sides of the waveguide transmission line 21, and the dielectric resonance units 20 disposed on different sides are staggered.

That the dielectric resonance units 20 disposed on different sides are staggered means: It may be considered that the waveguide transmission line 21 is formed by a plurality of transmission line segments, and each transmission line segment in the waveguide transmission line 21 is corresponding to and coupled to one dielectric resonance unit 20.

Optionally, as shown in FIG. 4A, some of the plurality of dielectric resonance units 20 are located on the side on which the second surface a2 of the waveguide transmission line 21 is located, and the other of the dielectric resonance units 20 are located on the side on which the third surface a3 of the waveguide transmission line 21 is located.

Figure 7B:
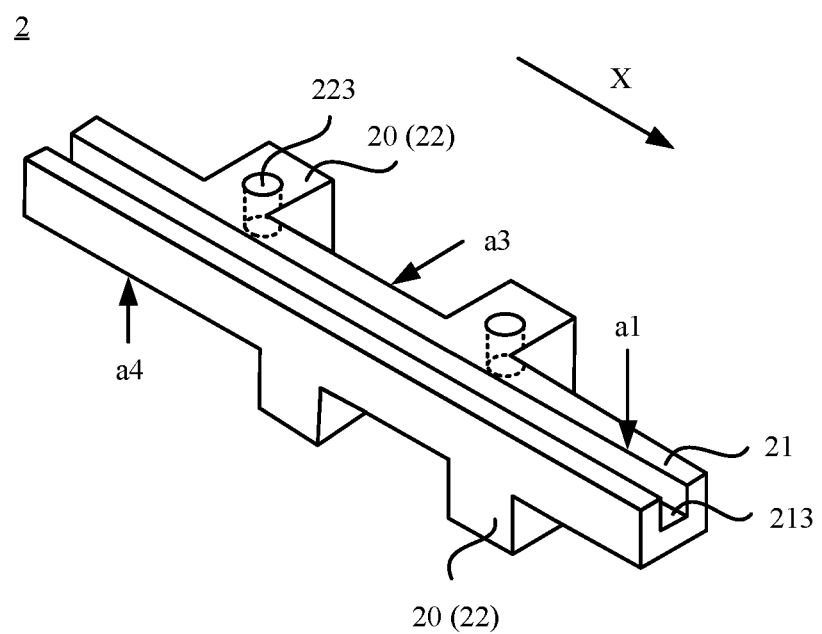
FIG. 7B is a schematic diagram of a structure of still another band-stop filter according to an embodiment of this application.

Optionally, as shown in FIG. 7B, some of the plurality of dielectric resonance units 20 are located on the side on which the fourth surface a4 of the waveguide transmission line 21 is located, and the other of the dielectric resonance units 20 are located on the side on which the third surface a3 of the waveguide transmission line 21 is located.

Optionally, some of the plurality of dielectric resonance units 20 are located on the side on which the fourth surface a4 of the waveguide transmission line 21 is located, and the other of the dielectric resonance units 20 are located on the side on which the second surface a2 of the waveguide transmission line 21 is located.

Figure 7C:
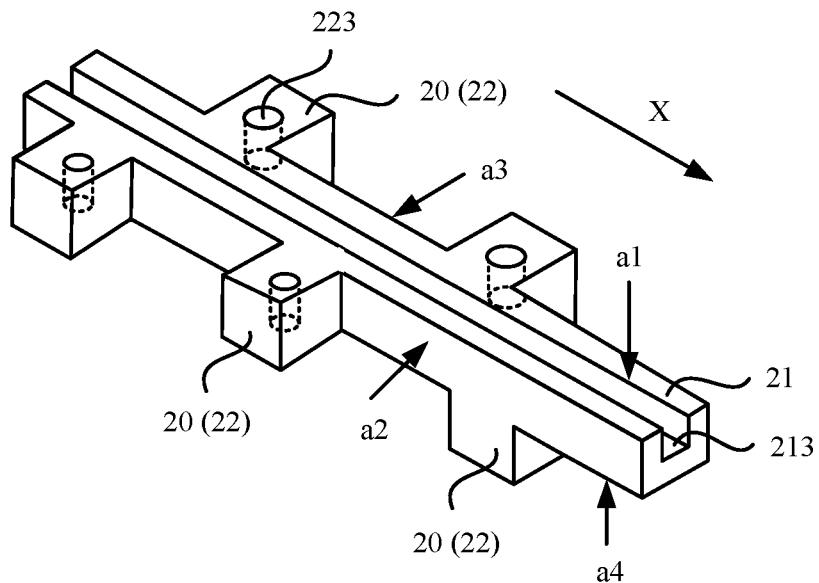
FIG. 7C is a schematic diagram of a structure of still another band-stop filter according to an embodiment of this application.

Optionally, as shown in FIG. 7C, the plurality of dielectric resonance units 20 are divided into three parts. The first part of the dielectric resonance units 20 are located on the side on which the fourth surface a4 of the waveguide transmission line 21 is located, the second part of the dielectric resonance units 20 are located on the side on which the second surface a2 of the waveguide transmission line 21 is located, and the third part of the dielectric resonance units 20 are located on the side on which the third surface a3 of the waveguide transmission line 21 is located.

When the plurality of dielectric resonance units 20 are distributed on a plurality of sides of the waveguide transmission line 21, this embodiment of this application sets no limitation on a quantity of dielectric resonance units 20 distributed on each side and an arrangement manner thereof, and the accompanying drawings are merely an example.

In some embodiments, a process and structure can be simplified, to omit a process step of connecting the dielectric resonance units 20 to the waveguide transmission line 21. In some embodiments, the plurality of dielectric resonance units 20 and the waveguide transmission line 21 are an integrated structure.

That the plurality of dielectric resonance units 20 and the waveguide transmission line 21 are an integrated structure may be understood as follows: The first dielectric block 221 and the second dielectric block 211 are an integrated structure, and the first conductive layer 222 and the third conductive layer 212 are an integrated structure.

Figure 8A:
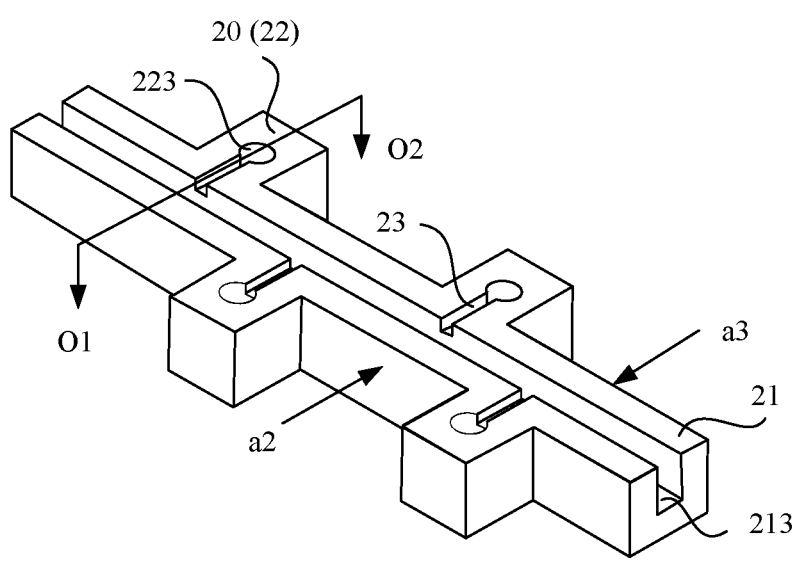
FIG. 8A is a schematic diagram of a structure of still another band-stop filter according to an embodiment of this application.

In some embodiments, as shown in FIG. 8A, the band-stop filter 2 further includes at least one coupling channel 23. The coupling channel 23 is disposed between the waveguide transmission line 21 and the dielectric resonator 22 that is in the dielectric resonance unit 20 and that is closest to the waveguide transmission line. The coupling channel 23 communicates with the blind hole 223 in the dielectric resonator 22.

Optionally, as shown in FIG. 8A, the coupling channel 23 is a coupling groove located between the blind hole 223 and the groove 213, and two ends of the coupling groove respectively communicate with the blind hole 223 and the groove 213 in the dielectric resonator 22 that is in the dielectric resonance unit 20 and that is closest to the waveguide transmission line.

For ease of processing, as shown in FIG. 8A, a groove opening of the coupling groove and the groove opening of the groove 213 are located on a same side of the band-stop filter 2.

Optionally, the dielectric resonance units 20 are located on the sides on which the second surface a2 and the third surface a3 of the waveguide transmission line 21 are located. The aperture of the blind hole 223 of the dielectric resonator 22 in the dielectric resonance unit 20, the groove opening of the coupling groove, and the groove opening of the groove 213 are located on a same side of the band-stop filter 2.

A coupling bandwidth between the dielectric resonator 22 and the waveguide transmission line 21 may be adjusted by adjusting a groove depth and a groove width of the coupling groove.

Figure 8B:
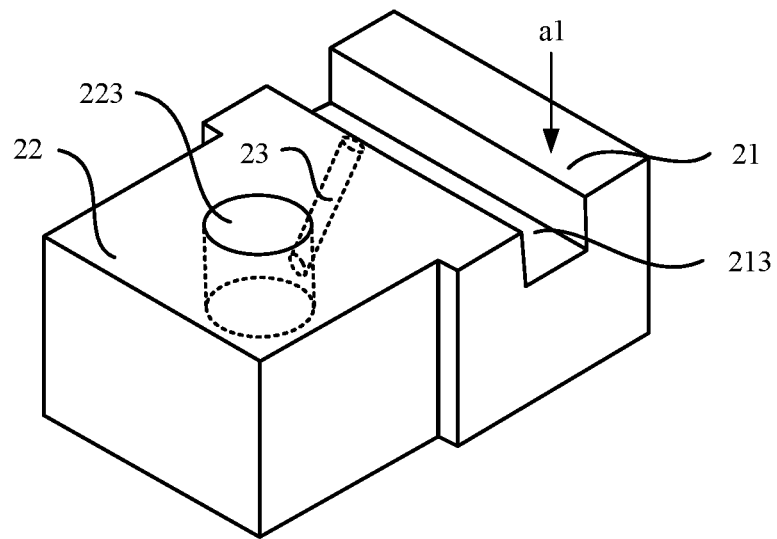
FIG. 8B is a schematic diagram of a structure of still another band-stop filter according to an embodiment of this application.

In another possible embodiment, as shown in FIG. 8B, the coupling channel 23 is a coupling hole located between the blind hole 223 and the groove 213, and two ends of the coupling hole respectively communicate with the blind hole 223 and the groove 213.

A coupling bandwidth between the dielectric resonator 22 and the waveguide transmission line 21 may be adjusted by adjusting an aperture of the coupling hole and a distance from the coupling hole to the first surface a1 of the waveguide transmission line 21.

Regardless of whether the coupling channel 23 is a coupling groove or a coupling hole, as shown in FIG. 8A, the coupling channel 23 may vertically intersect and communicate with the groove 213. As shown in FIG. 8B, the coupling channel 23 may alternatively non-vertically intersect and communicate with the groove 213, provided that the coupling channel 23 communicates with the groove 213 and the blind hole 223.

Figure 8C:
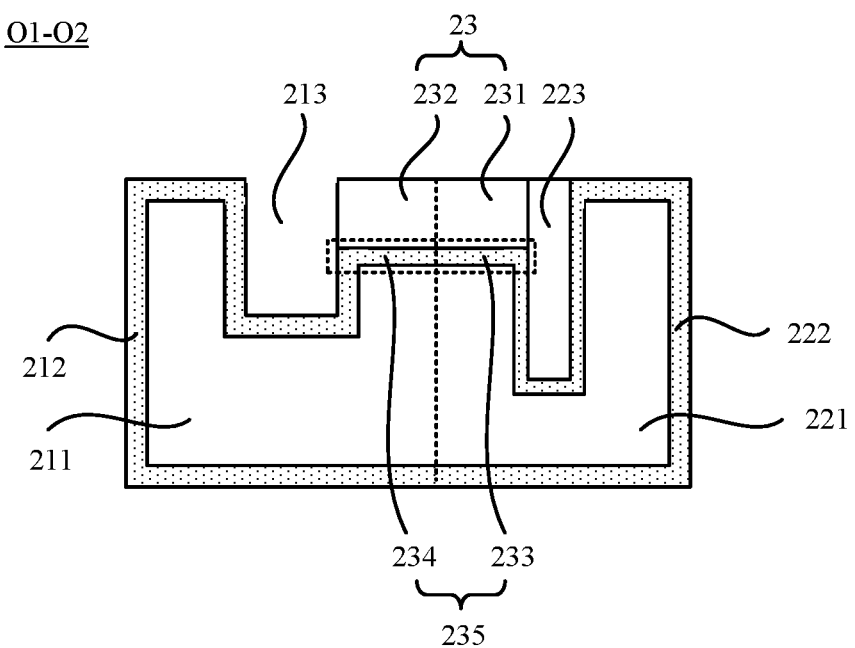
FIG. 8C is a cross-sectional view along an O1-O2 direction in FIG. 8A.

In addition, as shown in FIG. 8C, the band-stop filter 2 further includes a second conductive layer 235, and the second conductive layer 235 covers an inner surface of the coupling channel 23.

As shown in FIG. 8C, for example, the coupling channel 23 is a coupling groove. The coupling channel 23 may be understood as including a first coupling sub-groove 231 and a second coupling sub-groove 232 that communicate with each other. The first coupling sub-groove 231 is located in the first dielectric block 221, and the first coupling sub-groove 231 communicates with the blind hole 223. The second coupling sub-groove 232 is located in the second dielectric block 211, and the second coupling sub-groove 232 communicates with the groove 213. In this way, the blind hole 223 communicates with the groove 213 through the coupling groove.

Similarly, the second conductive layer 235 may be understood as including a first conductive sub-layer 233 covering the first coupling sub-groove 231 and a second conductive sub-layer 234 covering the second coupling sub-groove 232. The first conductive sub-layer 233 is a part of the first conductive layer 222, and the second conductive sub-layer 234 is a part of the third conductive layer 212.

A relatively strong electromagnetic field distribution exists between a hole bottom of the blind hole 223 and a surface of the first dielectric block 221 that is far away from the blind hole 223, a relatively strong electromagnetic field distribution exists between a groove bottom of the groove 213 and a surface of the second dielectric block 211 that is far away from the groove opening of the groove 213, and a current is largest at the hole bottom of the blind hole 223 and the groove bottom of the groove 213. Disposing the coupling channel 23 is equivalent to directing a location with a largest current upwards. This can enhance an electromagnetic field energy exchange between the dielectric resonator 22 and the waveguide transmission line 21. Therefore, by disposing the coupling channel 23 that connects the groove 213 to the blind hole 223, the coupling bandwidth between the dielectric resonator 22 and the waveguide transmission line 21 can be increased.

Figure 9A:
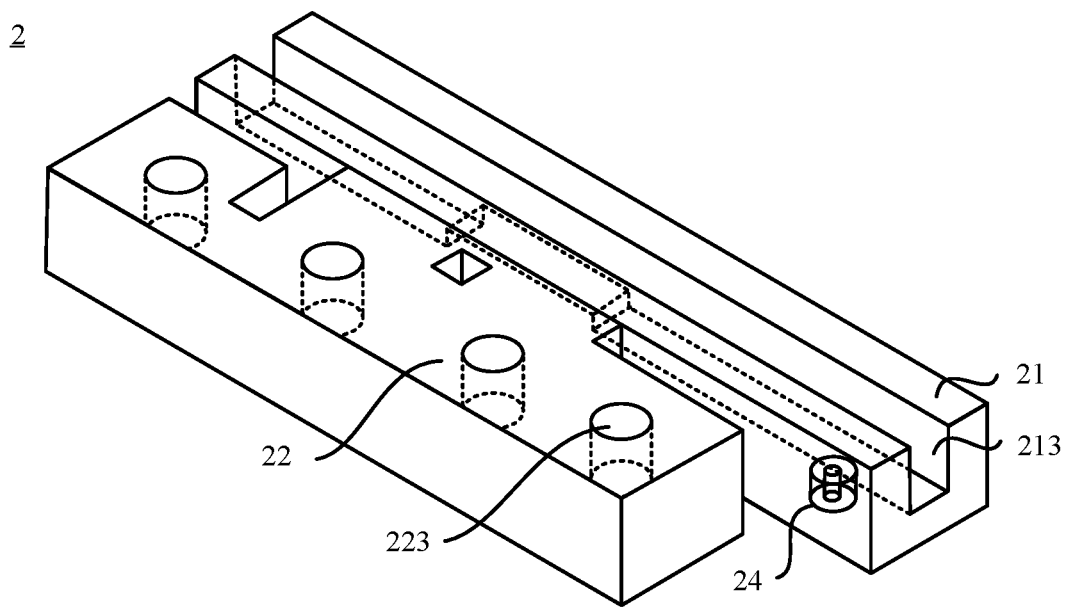
FIG. 9A is a schematic diagram of a structure of still another band-stop filter according to an embodiment of this application.

In some embodiments, as shown in FIG. 9A, the band-stop filter 2 further includes a coaxial waveguide converter 24. The coaxial waveguide converter 24 serves as an input/output port of the band-stop filter 2, to implement electrical interconnection between the band-stop filter 2 and an external component.

In FIG. 9A, a solid line is used for illustration, to clearly illustrate a structure of the coaxial waveguide converter 24.

Figure 9B:
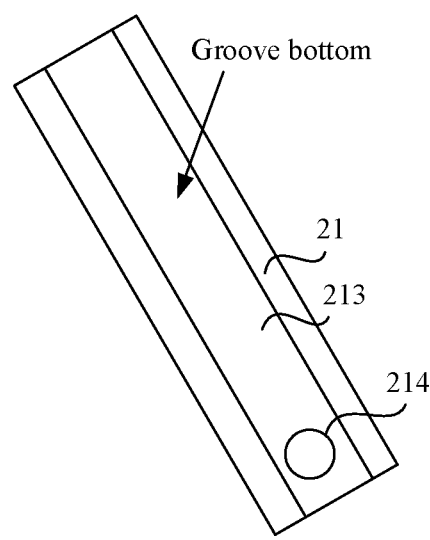
FIG. 9B is a top view of a through hole on a waveguide transmission line according to an embodiment of this application.

Optionally, as shown in FIG. 9B (a top view), the groove bottom of the groove 213 has a through hole 214 that runs through the waveguide transmission line 21 along a groove depth direction of the groove 213.

A location of the through hole 214 is not limited, provided that performance of the band-stop filter 2 is met.

Figure 9C:
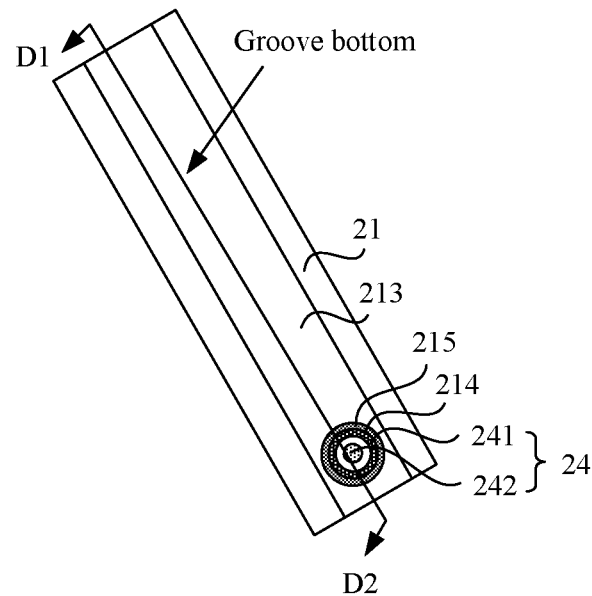
FIG. 9C is a top view of a waveguide transmission line according to an embodiment of this application.

As shown in FIG. 9C, an inner surface of the through hole 214 is covered with a fourth conductive layer 241. A conductive column 242 is disposed in the through hole 214. The fourth conductive layer 241 and the conductive column 242 serve as the coaxial waveguide converter 24 of the band-stop filter 2.

A shape of the conductive column 242 is not limited, and the conductive column 242 may be a cylindrical column, a rectangular column, or the like. The conductive column 242 may be fixed by electrically connecting the conductive column 242 to the fourth conductive layer 241.

It can be understood that, to avoid a short circuit, both the first conductive layer 222 located on the surface of the dielectric filter 22 and the third conductive layer 212 located on the surface of the waveguide transmission line 21 are insulated from the fourth conductive layer 241 and the conductive column 242.

For example, as shown in FIG. 9C, an insulation ring 215 may be formed at a periphery of an aperture of the through hole 214, and the fourth conductive layer 241 may be separated from the first conductive layer 222 by using the insulation ring 215, to implement insulation between the fourth conductive layer 241 and the first conductive layer 222.

Alternatively, a gap is formed at a periphery of an aperture of the through hole 214, and the fourth conductive layer 241 is separated from the first conductive layer 222 by using the gap, to implement insulation between the fourth conductive layer 241 and the first conductive layer 222.

Figure 9D:
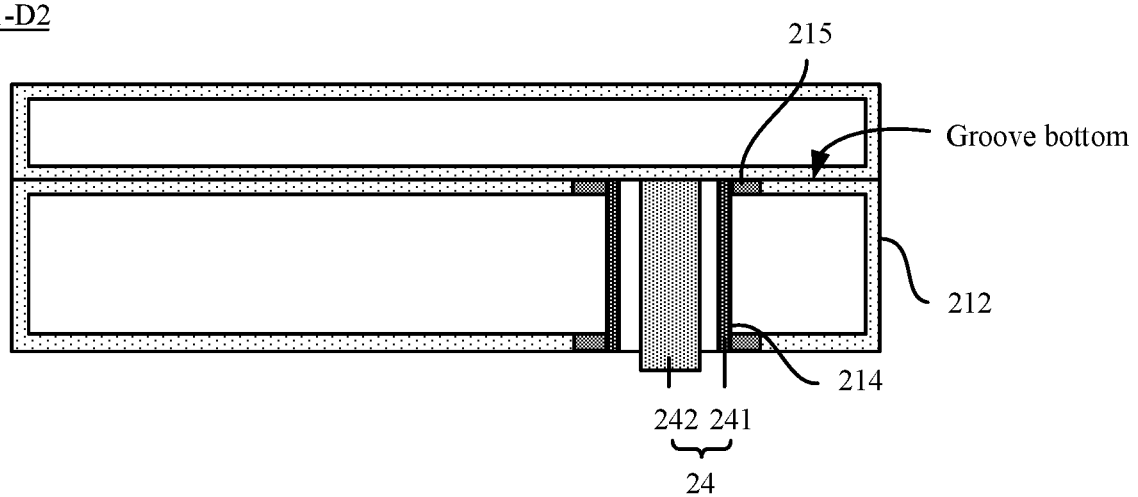
FIG. 9D is a cross-sectional view along a D1-D2 direction in FIG. 9C.

In some embodiments, as shown in FIG. 9D (a cross-sectional view along a D1-D2 direction in FIG. 9C), a side of the conductive column 242 that is away from the groove 213 extends to an outside of the through hole 214.

In this case, when the band-stop filter 2 needs to be electrically connected to an external component, for example, when the band-stop filter 2 needs to be connected to a printed circuit board (PCB), the conductive column 242 may be directly welded to the PCB, to connect the band-stop filter 2 to the PCB to perform signal transmission.

Alternatively, the conductive column 242 is connected to a connector, and the connector is connected to a PCB, to implement a connection between the band-stop filter 2 and the PCB. The band-stop filter 2 is inserted into a required location by using the connector, and is applicable as an external anti-interference filter. The band-stop filter 2 can be miniaturized compared with an anti-interference filter with a metal cavity in a related technology.

According to the band-stop filter 2 provided in this embodiment of this application, a function of the band-stop filter 2 is implemented by using the dielectric waveguide transmission line and the dielectric resonator. Because the first dielectric block 221 and the second dielectric block 211 each use a material with a relatively large dielectric constant and a low loss, their sizes are relatively small at a same resonance frequency. In addition, the first conductive layer 222 and the third conductive layer 212 can provide a function of shielding an electromagnetic wave, and a loss is relatively small. Therefore, the size of the band-stop filter 2 can be reduced, and further impact on a Q value of the band-stop filter 2 is relatively small while the size can be reduced. This enables the band-stop filter 2 to still have relatively good insertion loss performance even when a rejection degree is high.

Embodiment 2

A difference between Embodiment 2 and Embodiment 1 lies in that the waveguide transmission line 21 has a different structure.

Figure 10A:
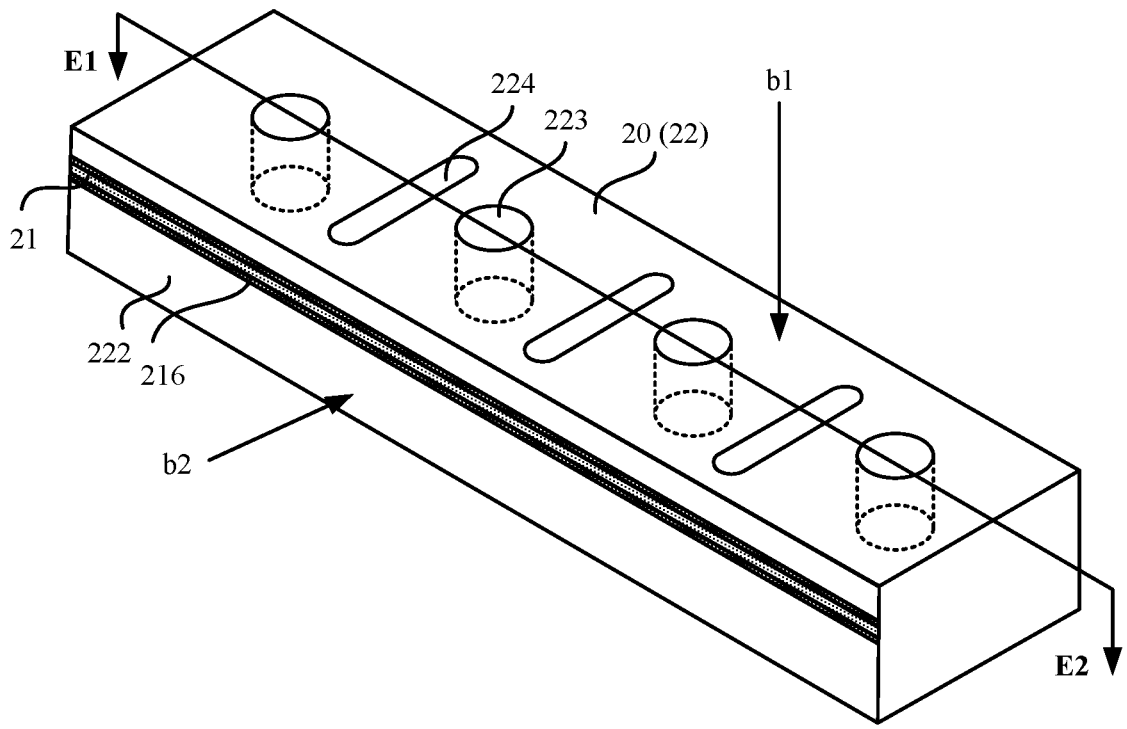
FIG. 10A is a schematic diagram of a structure of still another band-stop filter according to an embodiment of this application.

As shown in FIG. 10A, the band-stop filter 2 includes a waveguide transmission line 21 and a plurality of dielectric resonance units 20.

The waveguide transmission line 21 is a coplanar waveguide transmission line. For example, the waveguide transmission line 21 is a metal line, and the waveguide transmission line 21 is disposed on a surface of the dielectric resonance unit 20.

In an extension direction of the waveguide transmission line 21, locations of the waveguide transmission line 21 may have different line widths, to adjust coupling strength between the waveguide transmission line 21 and the dielectric resonance unit 20.

For example, the plurality of dielectric resonance units 20 may be an integrated structure. A separation opening 224 may be disposed between adjacent dielectric resonance units 20, and the separation opening 224 runs through the dielectric resonance unit 20.

Figure 10B:
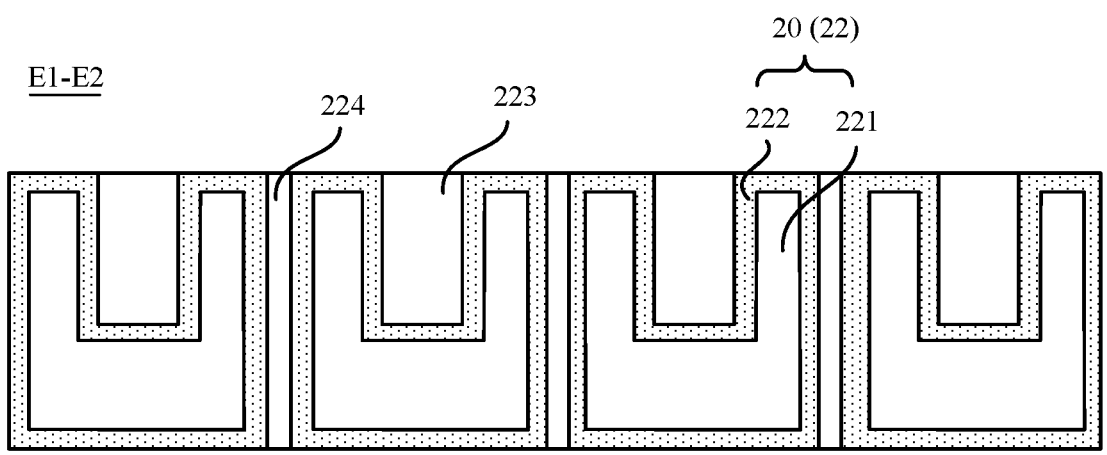
FIG. 10B is a cross-sectional view along an E1-E2 direction in FIG. 10A.

For a running-through direction of the separation opening 224, in a possible embodiment, as shown in FIG. 10B (a cross-sectional view along an E1-E2 direction in FIG. 10A), the separation opening 224 runs through the dielectric resonance unit 20 along a hole depth direction of a blind hole 223 in a dielectric resonator 22.

Figure 10C:
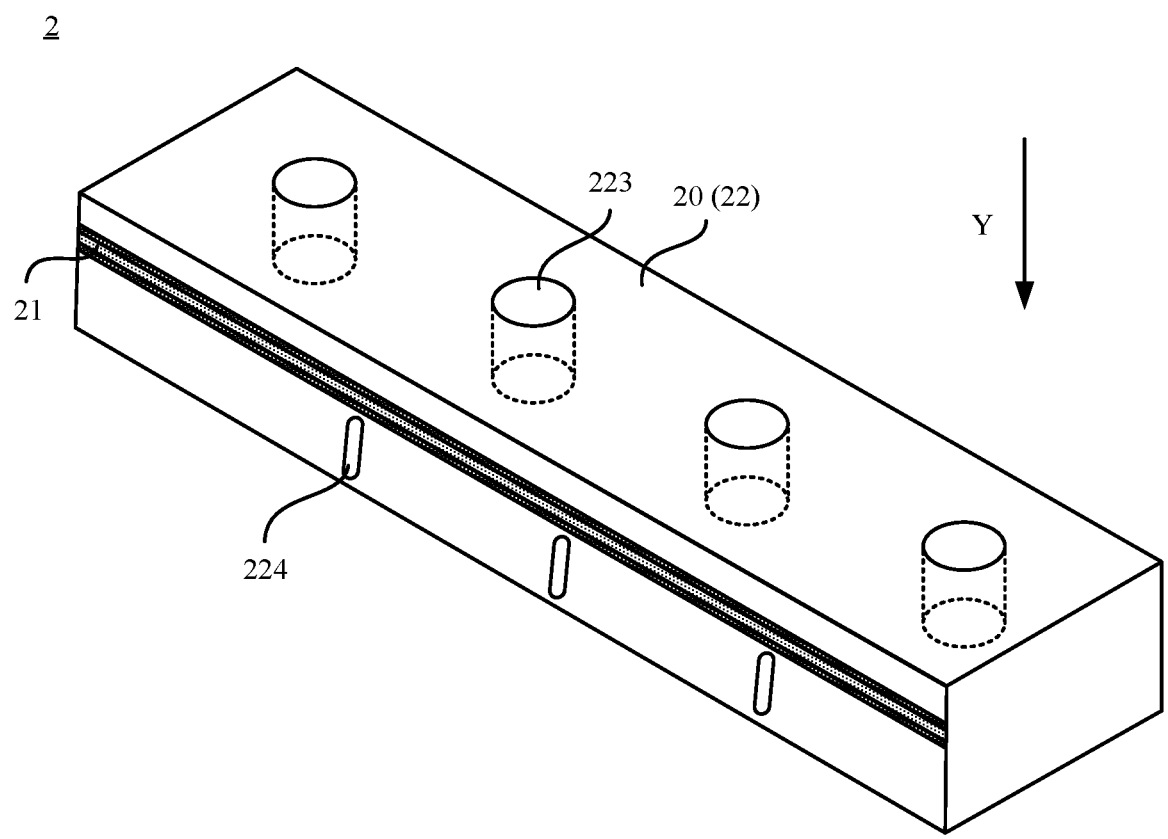
FIG. 10C is a schematic diagram of a structure of still another band-stop filter according to an embodiment of this application.

For a running-through direction of the separation opening 224, in another possible embodiment, as shown in FIG. 10C, the separation opening 224 runs through the dielectric resonance unit 20 in a direction perpendicular to a hole depth Y of a blind hole 223.

It should be noted that, because a first conductive layer 222 is also disposed on an inner surface of the separation opening 224, as shown in FIG. 10C, when an aperture of the separation opening 224 and the waveguide transmission line 21 are located on a same surface of the dielectric resonator 22, the waveguide transmission line 21 and the separation opening 224 are staggered, to avoid a short circuit between the waveguide transmission line 21 and the first conductive layer 222 located in the separation opening 224.

For ease of processing, in some embodiments, as shown in FIG. 10A, the separation opening 224 is disposed on a same side as the blind hole 223, and the separation opening 224 and the blind hole 223 may be processed from the same side.

For a simplified a process, as shown in FIG. 10A, in some embodiments, the waveguide transmission line 21 is disposed on surfaces (first surfaces b1) that are of all the dielectric resonance unit 20 and that face a same side.

Because the separation opening 224 is a through structure, to reduce impact of the separation opening 224 and the blind hole 223 on the waveguide transmission line 21 and to facilitate preparation, in some embodiments, as shown in FIG. 10A, the waveguide transmission line 21 and the separation opening 224 are disposed on different surfaces. The waveguide transmission line 21 and an aperture of the blind hole 223 are disposed on different surfaces.

A smaller distance indicates stronger electric field coupling and a larger coupling bandwidth. Therefore, a distance between the blind hole 223 and the waveguide transmission line 21 is related to a coupling bandwidth between the waveguide transmission line 21 and the dielectric resonator 22. Therefore, the coupling bandwidth between the waveguide transmission line 21 and the dielectric resonator 22 may be adjusted by adjusting the distance between the blind hole 223 and the waveguide transmission line 21, to meet a requirement.

For a location of the waveguide transmission line 21, in a possible embodiment, as shown in FIG. 10A, the waveguide transmission line 21 is located on a second surface b2 of the dielectric resonance unit 20. The second surface b2 of the dielectric resonance unit 20 intersects the first surface b1 of the dielectric resonance unit 20.

Figure 10D:
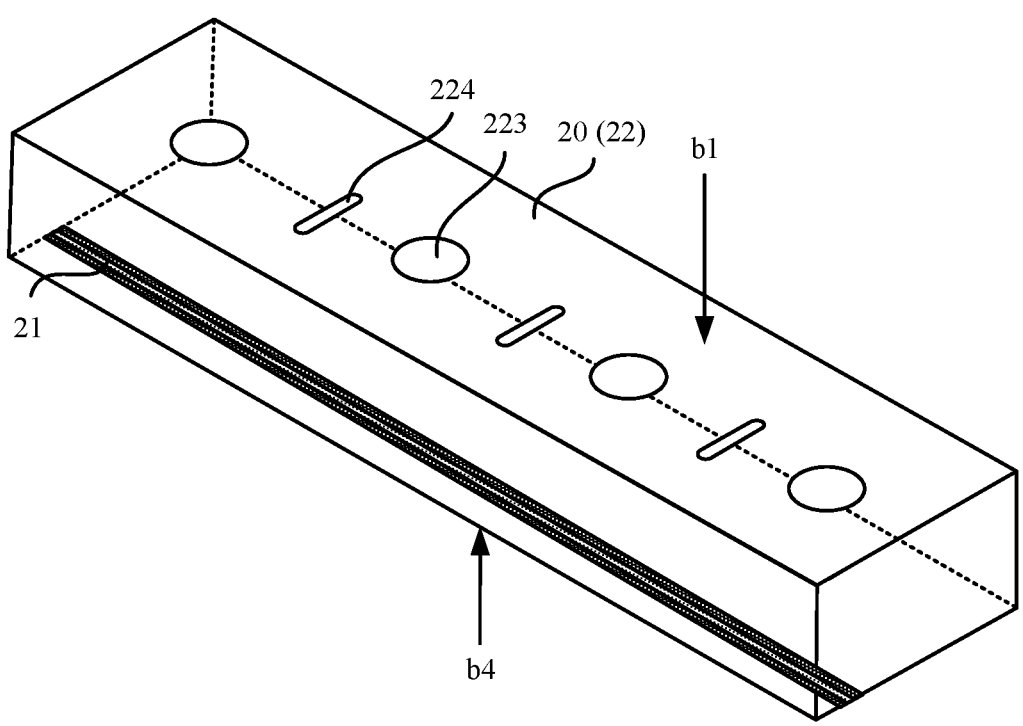
FIG. 10$d$ is a schematic diagram of a structure of still another band-stop filter according to an embodiment of this application.

In another possible embodiment, as shown in FIG. 10d, the waveguide transmission line 21 is located on a fourth surface b4 of the dielectric resonance unit 20. The fourth surface b4 of the dielectric resonance unit 20 and the first surface b1 of the dielectric resonance unit 20 are disposed opposite to each other.

It should be noted that, each dielectric resonator 22 in the dielectric resonance unit 20 includes a first dielectric block 221 and a first conductive layer 222 covering an outer surface of the first dielectric block 221. When the waveguide transmission line 21 is a coplanar waveguide transmission line, the waveguide transmission line 21 is formed by a conductive material. Therefore, to avoid a short circuit, the first conductive layer 222 needs to be insulated from the waveguide transmission line 21. The first conductive layer 222 and the waveguide transmission line 21 may have a same material.

As shown in FIG. 10A, for example, an insulation strip 216 may be disposed between the waveguide transmission line 21 and the first conductive layer 222, so that the waveguide transmission line 21 is insulated from the first conductive layer 222. The insulation strip 216 is disposed on a surface of the first dielectric block 221, and the waveguide transmission line 21 and the first conductive layer 222 are respectively disposed on two sides of the insulation strip 216.

Alternatively, a gap is formed between the waveguide transmission line 21 and the first conductive layer 222, so that the waveguide transmission line 21 is insulated from the first conductive layer 222.

Figure 11:
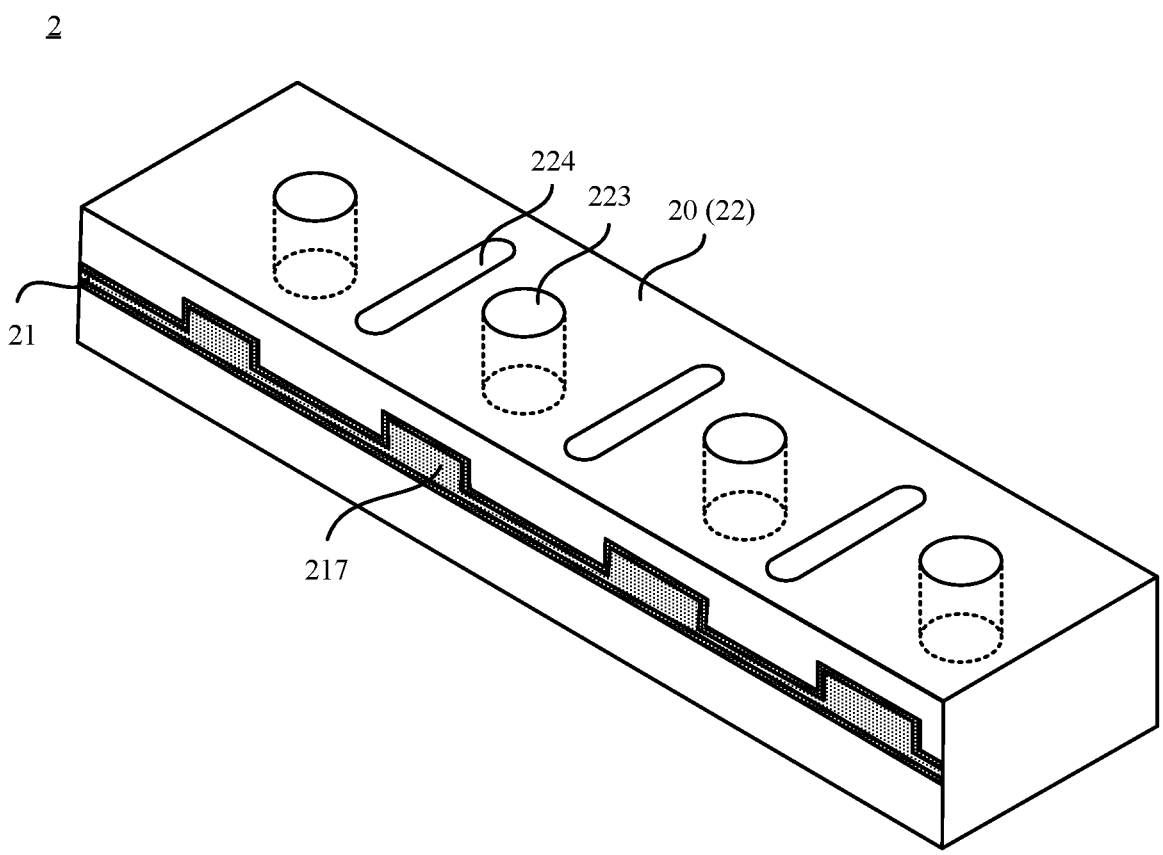
FIG. 11 is a schematic diagram of a structure of still another band-stop filter according to an embodiment of this application.

Regardless of a specific surface, of the dielectric resonance unit 20, on which the waveguide transmission line 21 is located, the first conductive layer 222 serves as a reference ground of the band-stop filter 2, to form an electromagnetic field distribution between the first conductive layer 222 and the waveguide transmission line 21. In some embodiments, as shown in FIG. 11, the band-stop filter 2 further includes open-circuit stubs 217.

For example, portions in the waveguide transmission line 21 serve as the open-circuit stubs 217.

That is, the waveguide transmission line 21 forms the open-circuit stubs 217 by increasing widths partially. A shape of the open-circuit stub 217 is not limited, and may be any shape such as a rectangle, a triangle, a circle, or the like.

One open-circuit stub 217 is coupled to one dielectric resonance unit 20. However, a quantity of open-circuit stubs 217 coupled to each dielectric resonance unit 20 is not limited to 1, and such coupling may be arranged as required.

In addition, a capacitive coupling structure is formed between the open-circuit stub 217 and the dielectric resonance unit 20. The coupling bandwidth between the waveguide transmission line 21 and the dielectric resonance unit 20 may be adjusted by adjusting an area of the open-circuit stub 217.

In some embodiments, the band-stop filter 2 further includes a coupling channel 23, and the coupling channel 23 is a coupling hole located in the first dielectric block 221.

Figure 12A:
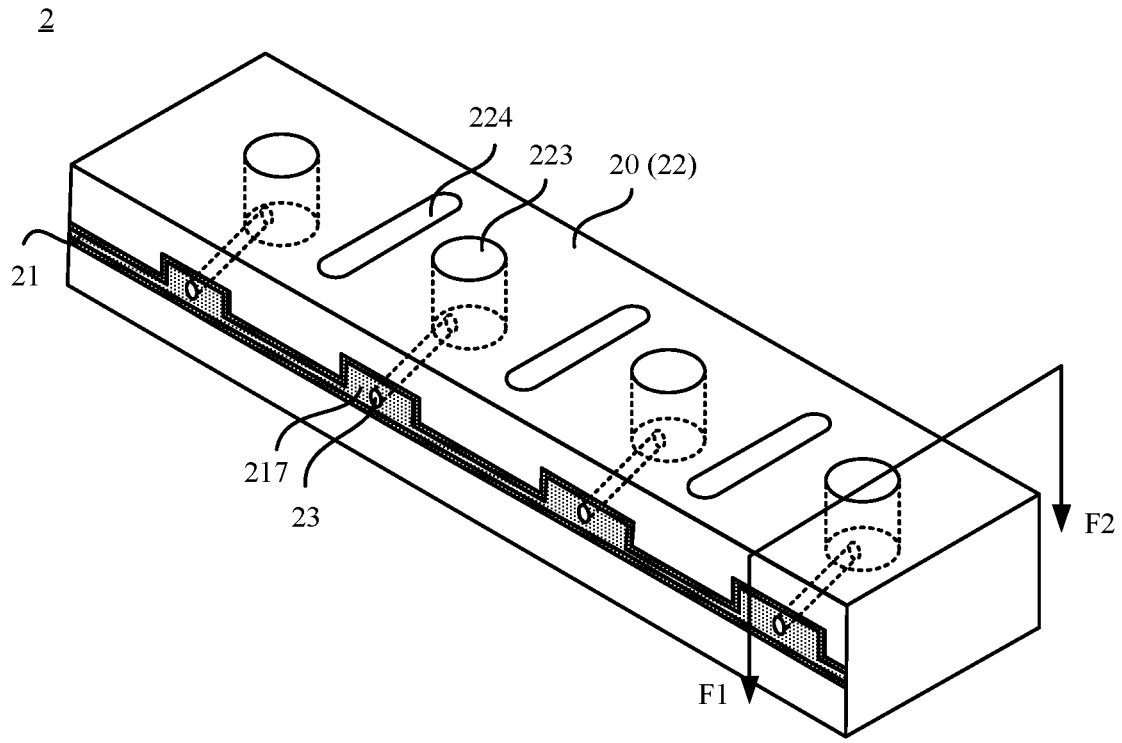
FIG. 12A is a schematic diagram of a structure of still another band-stop filter according to an embodiment of this application.

The coupling bandwidth between the waveguide transmission line 21 and the dielectric resonator 22 may be adjusted by adjusting a distance from the coupling hole to the first surface b1 of the dielectric resonance unit 20. For a location of an aperture of the coupling hole, in a possible embodiment, as shown in FIG. 12A, when the band-stop filter 2 includes the open-circuit stub 217, the aperture of the coupling hole is located on the open-circuit stub 217.

That is, the coupling hole sinks into a side on which the waveguide transmission line 21 is located. The aperture of the coupling hole is located on the open-circuit stub 217, and the coupling hole is made to communicate with the blind hole 223.

Figure 12B:
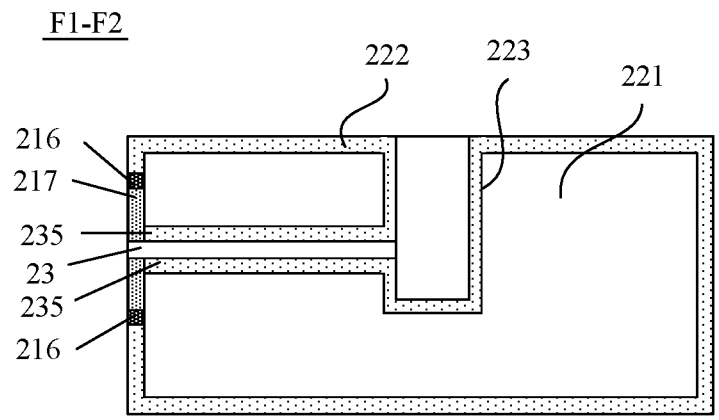
FIG. 12B is a cross-sectional view along an F1-F2 direction in FIG. 12A.

It should be noted that, as shown in FIG. 12B (a cross-sectional view along an F1-F2 direction in FIG. 12A), a second conductive layer 235 covers an inner surface of the coupling channel 23. One end of the second conductive layer 235 that is close to the open-circuit stub 217 is electrically connected to the open-circuit stub 217, and the other end of the second conductive layer 235 that is close to the blind hole 223 is electrically connected to the first conductive layer 222.

For a location of an aperture of the coupling hole, in another possible embodiment, when the band-stop filter 2 includes the open-circuit stub 217, the aperture of the coupling hole may alternatively be located on the waveguide transmission line 21.

In this case, a second conductive layer 235 covers an inner surface of the coupling channel 23. One end of the second conductive layer 235 that is close to the waveguide transmission line 21 is electrically connected to the waveguide transmission line 21, and the other end of the second conductive layer 235 that is close to the blind hole 223 is electrically connected to the first conductive layer 222.

Figure 12C:
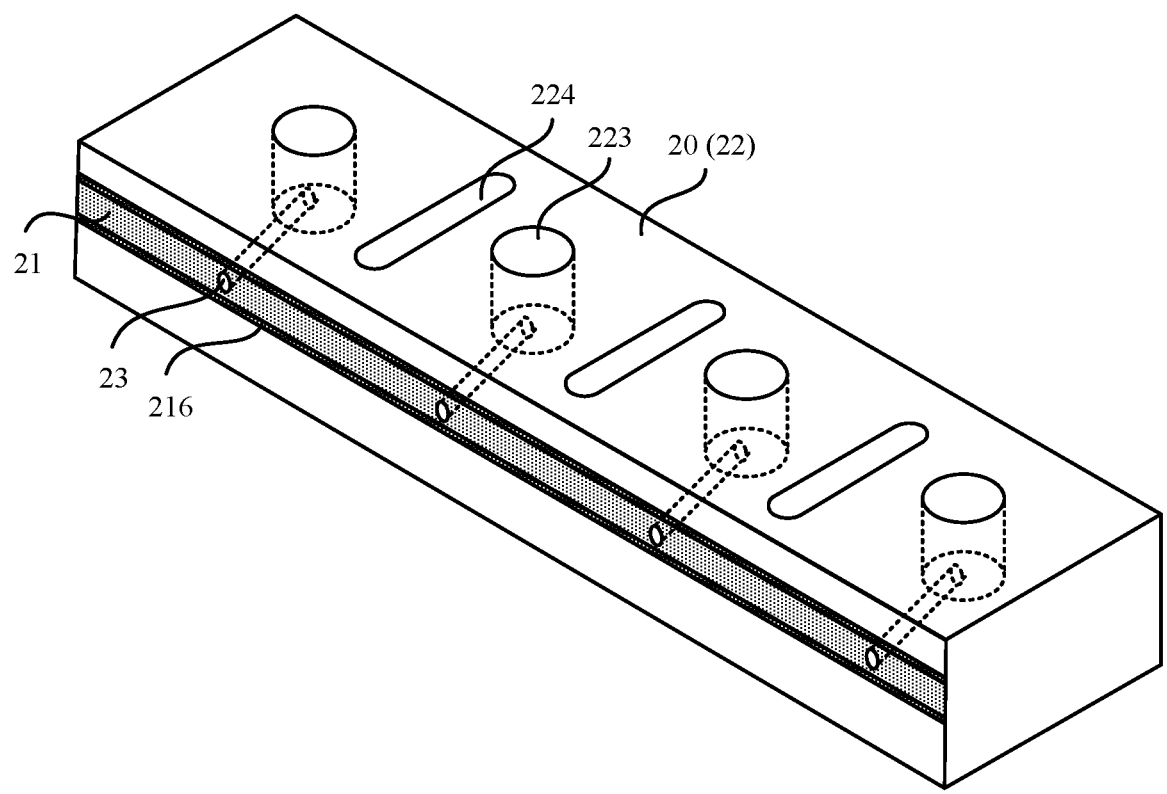
FIG. 12C is a schematic diagram of a structure of still another band-stop filter according to an embodiment of this application.

For a location of an aperture of the coupling hole, in another possible embodiment, as shown in FIG. 12C, when the band-stop filter 2 includes no open-circuit stub 217, the aperture of the coupling hole is located on the waveguide transmission line 21.

In this case, a second conductive layer 235 covers an inner surface of the coupling channel 23. One end of the second conductive layer 235 that is close to the waveguide transmission line 21 is electrically connected to the waveguide transmission line 21, and the other end of the second conductive layer 235 that is close to the blind hole 223 is electrically connected to the first conductive layer 222.

In the band-stop filter 2 provided in this embodiment of this application, a coplanar waveguide transmission line is used as the waveguide transmission line 21 of the band-stop filter 2, so that a size of the band-stop filter 2 can be further reduced, and the band-stop filter 2 can be miniaturized.

In addition, because the waveguide transmission line 21 is directly exposed outside, the waveguide transmission line 21 may be directly electrically connected to a trace or a connector on a printed circuit board, and a structure is simple.

The foregoing descriptions are merely specific implementations of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A band-stop filter, comprising:
    a waveguide transmission line, configured to transmit electromagnetic waves; and
    a plurality of dielectric resonance units sequentially arranged along an extension track of the waveguide transmission line, and configured to be coupled to the waveguide transmission line, wherein each dielectric resonance unit of the plurality of dielectric resonance units comprises at least one dielectric resonator, wherein the at least one dielectric resonator comprises a first dielectric block and a first conductive layer covering an outer surface of the first dielectric block, a first surface of the first dielectric block has a blind hole, and the first conductive layer covers an inner surface of the blind hole;
    wherein a dielectric constant of a material that forms the first dielectric block is greater than 1;
    wherein the waveguide transmission line comprises a second dielectric block and a third conductive layer covering an outer surface of the second dielectric block;
    wherein a first surface of the second dielectric block has a groove, and the groove runs through the waveguide transmission line along the extension track of the waveguide transmission line; and
    wherein the third conductive layer covers an inner surface of the groove.

2. The band-stop filter according to claim 1, wherein the groove is a stepped groove or a flat groove.

3. The band-stop filter according to claim 1, wherein the waveguide transmission line is a bent line.

4. The band-stop filter according to claim 1, wherein the band-stop filter further comprises:
    a coupling channel, disposed between the waveguide transmission line and a first dielectric resonator included in a first dielectric resonance unit among the plurality of dielectric resonance units and that is closest to the waveguide transmission line, wherein the coupling channel communicates with a first blind hole in the first dielectric resonator; and
    a second conductive layer, covering an inner surface of the coupling channel.

5. The band-stop filter according to claim 4,
    wherein the coupling channel in the band-stop filter is a coupling groove located between the first blind hole and the groove, and the coupling groove comprises a first coupling sub-groove and a second coupling sub-groove that communicate with each other; and
    wherein the first coupling sub-groove is located in a first dielectric block of the first dielectric resonator and communicates with the first blind hole, and the second coupling sub-groove is located in the second dielectric block and communicates with the groove.

6. The band-stop filter according to claim 5,
    wherein the first dielectric resonance unit is located on a side of the band-stop filter on which a second surface of the waveguide transmission line that intersects the first surface of the second dielectric block is located; and wherein:
a groove opening of the coupling groove and a groove opening of the groove are located on a same side of the band-stop filter; and/or
an aperture of the first blind hole and the groove opening of the groove are located on a same side of the band-stop filter.

7. The band-stop filter according to claim 4, wherein the first dielectric resonance unit and a groove opening of the groove are disposed on different sides of the band-stop filter.

8. The band-stop filter according to claim 4,
wherein the waveguide transmission line is a metal line, and the waveguide transmission line is disposed on a surface of the first dielectric resonance unit; and
wherein a first conductive layer of the first dielectric resonator included in the first dielectric resonance unit is insulated from the waveguide transmission line.

9. The band-stop filter according to claim 8, wherein the band-stop filter further comprises open-circuit stubs, and portions in the waveguide transmission line serve as the open-circuit stubs, and one of the open-circuit stubs is coupled to one dielectric resonance unit of the plurality of dielectric resonance units.

10. The band-stop filter according to claim 8,
wherein the waveguide transmission line is located on a side of the band-stop filter on which a second surface of the first dielectric resonance unit that intersects a first surface of the first dielectric block of the first dielectric resonator is located; and
wherein the coupling channel in the band-stop filter is a coupling hole located in the first dielectric block of the first dielectric resonator, and an aperture of the coupling hole is located on the waveguide transmission line or an open-circuit stub included in the band-stop filter.

11. The band-stop filter according to claim 8, wherein an aperture of the first blind hole and the waveguide transmission line are disposed on different surfaces.

12. The band-stop filter according to claim 1, wherein the plurality of dielectric resonance units are distributed on a plurality of sides of the waveguide transmission line, and dielectric resonance units disposed on different sides of the band-stop filter are staggered.

13. The band-stop filter according to claim 1,
wherein a groove bottom of the groove has a through hole that runs through the waveguide transmission line along a groove depth direction of the groove, and an inner surface of the through hole is covered with a fourth conductive layer;
wherein a conductive column is disposed inside the through hole, and an end of the conductive column that is away from the groove extends to an outside of the through hole; and
wherein both the third conductive layer and the fourth conductive layer are insulated from the conductive column.

14. The band-stop filter according to claim 1, wherein the waveguide transmission line and the plurality of dielectric resonance units are an integrated structure.

15. An electronic device, comprising:
a printed circuit board; and
a band-stop filter, wherein the band-stop filter comprises:
a waveguide transmission line, configured to transmit electromagnetic waves; and
a plurality of dielectric resonance units sequentially arranged along an extension track of the waveguide transmission line, and configured to be coupled to the waveguide transmission line, wherein each dielectric resonance unit of the plurality of dielectric resonance units comprises at least one dielectric resonator, wherein the dielectric resonator comprises a first dielectric block and a first conductive layer covering an outer surface of the first dielectric block, a first surface of the first dielectric block has a blind hole, and the first conductive layer covers an inner surface of the blind hole;
wherein a dielectric constant of a material that forms the first dielectric block is greater than 1;
wherein:
a conductive column in the band-stop filter is electrically connected to the printed circuit board; or
the waveguide transmission line in the band-stop filter is a metal line, and the waveguide transmission line is electrically connected to the printed circuit board.

16. An electronic device comprising a band-stop filter, wherein the band-stop filter comprises:
a waveguide transmission line, configured to transmit electromagnetic waves; and
a plurality of dielectric resonance units sequentially arranged along an extension track of the waveguide transmission line, and configured to be coupled to the waveguide transmission line, wherein each dielectric resonance unit of the plurality of dielectric resonance units comprises at least one dielectric resonator, wherein the dielectric resonator comprises a first dielectric block and a first conductive layer covering an outer surface of the first dielectric block, a first surface of the first dielectric block has a blind hole, and the first conductive layer covers an inner surface of the blind hole;
wherein a dielectric constant of a material that forms the first dielectric block is greater than 1;
wherein the waveguide transmission line comprises a second dielectric block and a third conductive layer covering an outer surface of the second dielectric block;
wherein a first surface of the second dielectric block has a groove, and the groove runs through the waveguide transmission line along the extension track of the waveguide transmission line; and
wherein the third conductive layer covers an inner surface of the groove.

17. The electronic device according to claim 16, wherein the band-stop filter further comprises:
a coupling channel, disposed between the waveguide transmission line and a first dielectric resonator included in a first dielectric resonance unit among the plurality of dielectric resonance units and that is closest to the waveguide transmission line, wherein the coupling channel communicates with a first blind hole in the first dielectric resonator; and
a second conductive layer, covering an inner surface of the coupling channel.

18. The electronic device according to claim 16, further comprising:
a connector; and
wherein:
the connector is electrically connected to a conductive column in the band-stop filter; or the waveguide transmission line in the band-stop filter is a metal line, and the connector is electrically connected to the waveguide transmission line.

19. The electronic device according to claim 16, further comprising:
a printed circuit board; and
wherein:
a conductive column in the band-stop filter is electrically connected to the printed circuit board; or
the waveguide transmission line in the band-stop filter is a metal line, and the waveguide transmission line is electrically connected to the printed circuit board.

* * * * *